US012342680B2

(12) United States Patent
Sun et al.

(10) Patent No.: US 12,342,680 B2
(45) Date of Patent: Jun. 24, 2025

(54) DISPLAY PANEL AND DISPLAY DEVICE

(71) Applicants: Chongqing BOE Display Technology Co., Ltd., Chongqing (CN); BOE TECHNOLOGY GROUP CO., LTD., Beijing (CN)

(72) Inventors: Shicheng Sun, Beijing (CN); Jonguk Kwak, Beijing (CN); Dawei Shi, Beijing (CN); Wei Zhang, Beijing (CN); Tianlei Shi, Beijing (CN); Dongsheng Zhao, Beijing (CN); Jie Liu, Beijing (CN); Pei Wang, Beijing (CN)

(73) Assignees: CHONGQING BOE DISPLAY TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 457 days.

(21) Appl. No.: 17/780,388

(22) PCT Filed: Apr. 14, 2021

(86) PCT No.: PCT/CN2021/087152
§ 371 (c)(1),
(2) Date: May 26, 2022

(87) PCT Pub. No.: WO2021/208944
PCT Pub. Date: Oct. 21, 2021

(65) Prior Publication Data
US 2023/0006015 A1  Jan. 5, 2023

(30) Foreign Application Priority Data

Apr. 14, 2020 (CN) .......................... 202010292453.1

(51) Int. Cl.
*H10K 59/121* (2023.01)
*H10K 59/35* (2023.01)
*H10K 59/65* (2023.01)

(52) U.S. Cl.
CPC ....... *H10K 59/1213* (2023.02); *H10K 59/353* (2023.02); *H10K 59/65* (2023.02)

(58) Field of Classification Search
CPC ... H10K 59/1213; H10K 59/353; H10K 59/65
(Continued)

(56) References Cited

U.S. PATENT DOCUMENTS

2014/0354520 A1  12/2014 Sato et al.
2018/0151106 A1   5/2018 Peng et al.
(Continued)

FOREIGN PATENT DOCUMENTS

CN    107004392 A    8/2017
CN    109950284 A    6/2019
(Continued)

OTHER PUBLICATIONS

Office Action for the Chinese Patent Application No. 202010292453.1 issued by the Chinese Patent Office on Aug. 3, 2022.

*Primary Examiner* — Igwe U Anya
(74) *Attorney, Agent, or Firm* — XSENSUS LLP

(57) ABSTRACT

A display panel has a display region and a bezel region located on a periphery of the display region, and the display region includes a first region and a second region. The display panel includes a plurality of pixel driving circuits located in the first region and a plurality of pixel driving circuits located in the second region. A density of the pixel driving circuits in the first region is less than a density of the pixel driving circuits in the second region.

20 Claims, 17 Drawing Sheets

(58) Field of Classification Search
USPC .......................................................... 257/40
See application file for complete search history.

(56) References Cited

U.S. PATENT DOCUMENTS

| 2021/0012706 A1* | 1/2021 | Yang | ....................... G09G 3/32 |
| 2021/0265430 A1* | 8/2021 | Chang | .................... H10K 59/65 |

FOREIGN PATENT DOCUMENTS

| CN | 110288945 A | * | 9/2019 | ........... G09G 3/3225 |
| CN | 110444125 A | | 11/2019 | |
| CN | 110649080 A | * | 1/2020 | ........... G09G 3/3225 |
| CN | 111430433 A | | 7/2020 | |
| CN | 113362759 A | * | 9/2021 | |

* cited by examiner

DISPLAY PANEL AND DISPLAY DEVICE

CROSS-REFERENCE TO RELATED APPLICATIONS

This application is a national phase entry under 35 USC 371 of International Patent Application No. PCT/CN 2021/087152 filed on Apr. 14, 2021, which claims priority to Chinese Patent Application No. 202010292453.1, filed on Apr. 14, 2020, which are incorporated herein by reference in their entirety.

TECHNICAL HELD

The present disclosure relates to the field of display technologies, and in particular, to a display panel and a display device.

BACKGROUND

With the development of optical technologies and semiconductor technologies, a display device has the advantages of being lighter and thinner in size, lower in power consumption and larger in viewing angle, and the application range is increasingly wide. In addition, a component with a specific function such as an optical sensor may be further provided in the display device, thereby realizing more functions and further enhancing the practicability.

SUMMARY

In an aspect, a display panel is provided. The display panel has a display region and a bezel region located on a periphery of the display region, and the display region includes a first region and a second region. The display panel includes a plurality of pixel driving circuits located in the first region and a plurality of pixel driving circuits located in the second region. A density of the pixel driving circuits in the first region is less than a density of the pixel driving circuits in the second region.

In some embodiments, the plurality of pixel driving circuits located in the first region are distributed in rows and columns. A number of pixel driving circuits in each row ire the first region is less than a number of the columns of the plurality of pixel driving circuits in the first region.

In some embodiments, in the first region, each row of pixel driving circuits includes a plurality of circuit groups, each circuit group includes m pixel driving circuits that are continuously distributed, and m is greater than or equal to 1. No pixel driving circuit is disposed at n continuous positions between every two adjacent circuit groups in a row, and n is greater than or equal to 1.

In some embodiments, m is equal to n, and n is equal to 2.

In some embodiments, pixel driving circuits located in a same column in the first region are respectively distributed in odd-numbered rows, or are respectively distributed in even-numbered rows.

In some embodiments, the display panel further includes at least one first signal line and/or at least one second signal line. In the first region, pixel driving circuits located in two adjacent rows are connected in sequence through a first signal line in the at least one first signal line according to an arrangement sequence of the pixel driving circuits located in the two adjacent rows in a row direction. In the first region, pixel driving circuits located in two adjacent columns are connected in sequence through a second signal line in the at least one second signal line according to an arrangement sequence of the pixel driving circuits located in the two adjacent columns in a column direction. The pixel driving circuits connected to the second signal line are alternately distributed in odd-numbered rows and even-numbered rows.

In some embodiments, according to an arrangement sequence of pixel driving circuits in an i-th row and an (i+1)-th row in the row direction, scan signal terminals in the i-th row of pixel driving circuits and reset signal terminals in the (i+1)-th row of pixel driving circuits are connected in sequence through a first signal line in the at least one first signal line, and i is greater than or equal to 1.

In some embodiments, the display panel further includes a plurality of gate signal terminals, and an (i+1)-th gate signal terminal in the plurality of gate signal terminals, the scan signal terminals in the i-th row of pixel driving circuits, and the reset signal terminals in the (i+1)-th row of pixel driving circuits are connected in sequence through the first signal line.

In some embodiments, according to an arrangement sequence of pixel driving circuits in an i-th row and an (i+1)-th row in the row direction, enable signal terminals in the i-th row of pixel driving circuits and enable signal terminals in the (i+1)-th row of pixel driving circuits are connected in sequence through a first signal line in the at least one first signal line, and i is greater than or equal to 1.

In some embodiments, the display panel further includes a plurality of control signal terminals, in a case where i is an odd number, the enable signal terminals in the i-th row of pixel driving circuits are connected to an (i+1)/2-th control signal terminal in the plurality of control signal terminals, and in a case where i is an even number, the enable signal terminals in the i-th row of pixel driving circuits are connected to an i/2-th control signal terminal in the plurality of control signal terminals; and/or the display panel further includes an initialization voltage terminal connected to each pixel driving circuit.

In some embodiments, according to an arrangement sequence of pixel driving circuits in a j-th column and a (j+1)-th column in the column direction, supply voltage terminals in the j-th column of pixel driving circuits and supply voltage terminals in the (j+1)-th column of pixel driving circuits are connected in sequence through a second signal line in the at least one second signal line, and j is greater than or equal to 1.

In some embodiments, the display panel further includes a first voltage terminal. The first voltage terminal, the supply voltage terminals in the j-th column of pixel driving circuits, and the supply voltage terminals in the (j+1)-th column of pixel driving circuits are connected in sequence through the second signal line.

In some embodiments, according to an arrangement sequence of pixel driving circuits in a j-th column and a (j+1)-th column in the column direction, data terminals in the j-th column of pixel driving circuits and data terminals in the (j+1)-th column of pixel driving circuits are connected in sequence through a second signal line in the at least one second signal line, and j is greater than or equal to 1.

In some embodiments, the display panel further includes a plurality of data signal terminals. A data signal terminal in the plurality of data signal terminals, the data terminals in the j-th column of pixel driving circuits, and the data terminals in the (j+1)-th column of pixel driving circuits are connected in sequence through the second signal line.

In some embodiments, the display panel further includes a plurality of light-emitting devices. Each pixel driving circuit is coupled to a light-emitting device in the plurality of light emitting devices to constitute a light-emitting sub-pixel. A plurality of light-emitting sub-pixels include a first type of light-emitting sub-pixels, a second type of light-emitting sub-pixels and a third type of light-emitting sub-pixels. Light-emitting sub-pixels of a same type have a same light-emitting color, and light-emitting sub-pixels of different types have different light-emitting colors. In the first region, light-emitting sub-pixels located in an odd-numbered column in the plurality of light-emitting sub-pixels are first type of light-emitting sub-pixels, and light-emitting sub-pixels located in an even-numbered column in the plurality of light-emitting sub-pixels are second type of light-emitting sub-pixels and third type of light-emitting sub-pixels that are sequentially and alternately arranged in a column direction; or light-emitting sub-pixels located in an even-numbered column in the plurality of light-emitting sub-pixels are first type of light-emitting sub-pixels, and light-emitting sub-pixels located in an odd-numbered column in the plurality of light-emitting sub-pixels are second type of light-emitting sub-pixels and third type of light-emitting sub-pixels that are sequentially and alternately arranged in a column direction.

In some embodiments, in two adjacent columns of light-emitting sub-pixels, every three continuous sub-pixels of different types in the column direction constitute a light-emitting pixel.

In another aspect, a display device is provided. The display device includes the display panel in any one of the above embodiments.

In some embodiments, the display device further includes an optical sensor disposed on a side of the display panel facing away from a light exit surface of the display panel, and the optical sensor directly faces the first region.

BRIEF DESCRIPTION OF THE DRAWINGS

In order to describe technical solutions in embodiments of the present disclosure or the prior art more clearly, the accompanying drawings to be used in the embodiments or the prior art will be introduced briefly below. Obviously, the accompanying drawings to be described below are merely accompanying drawings of some embodiments of the present disclosure, and a person of ordinary skill in the art may obtain other drawings according to these drawings without any creative effort.

DETAILED DESCRIPTION

Figure 1:
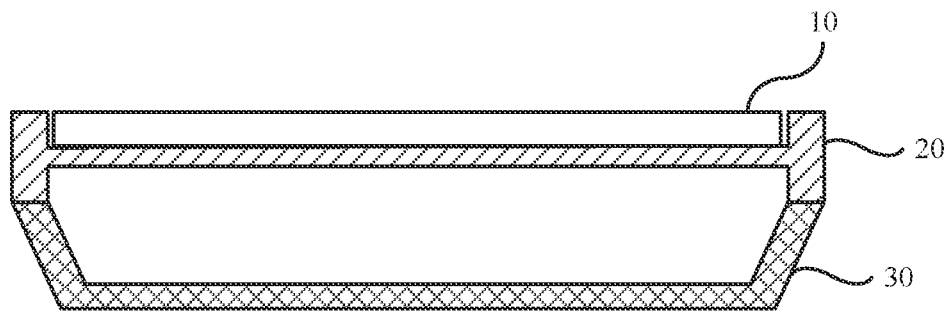
FIG. 1 is a structural diagram of a display device, in accordance with embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features.

In the description of the embodiments of the present disclosure, the term "a plurality of/the plurality of" means two or more unless otherwise specified.

In the description of some embodiments, the terms such as "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact with each other. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

As used herein, the term "if" is, optionally, construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is detected" or "in response to detecting [the stated condition or event]", depending on the context.

The use of the phase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about," "substantially" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

At present, display devices with a high screen-to-body ratio are becoming popular products for consumers. In order to increase the screen-to-body ratio, a technical solution of placing an optical sensor (e.g., a camera) on a side, facing away from a light exit surface, of a screen (i.e., a display panel) of a display device, is proposed in the related art. That is, the optical sensor is disposed below the display panel to form an under-screen optical sensor, so as to release a space occupied by the optical sensor in the display panel. In this design, external light needs to pass through the display panel to reach the under-screen optical sensor.

However, the display panel has a low light transmittance, so that the under-screen optical sensor receives insufficient light, which affects a function of the under-screen optical sensor.

In order to solve this problem, as shown in FIG. 1, some embodiments of the present disclosure provide a display device. The display device includes a display panel 10. The display device may further include a middle frame 20 for supporting the display panel 10, and a housing 30 for fixing and protecting the display panel 10 and the middle frame 20.

The display device may be applied to various scenes. For example, the display device may be a display, a television, a billboard, a digital photo frame, a laser printer with a display function, a telephone, a mobile phone, a personal digital assistant (FDA), a digital camera, a camcorder, a viewfinder, a navigator, a display device for a vehicle, a large-area wall display device, a home appliance, an information inquiry device (e.g., a business inquiry device of an e-government, a bank, a hospital or an electric power department), or a monitor.

For example, the display panel may be an organic light-emitting diode (OLED) panel, a quantum dot light-emitting diode (QLED) panel, a micro light-emitting diode (including a mini-LED or a micro-LED) panel. For clarity, a related description will be made in an example where the display panel is the OLED display panel.

Figure 2:
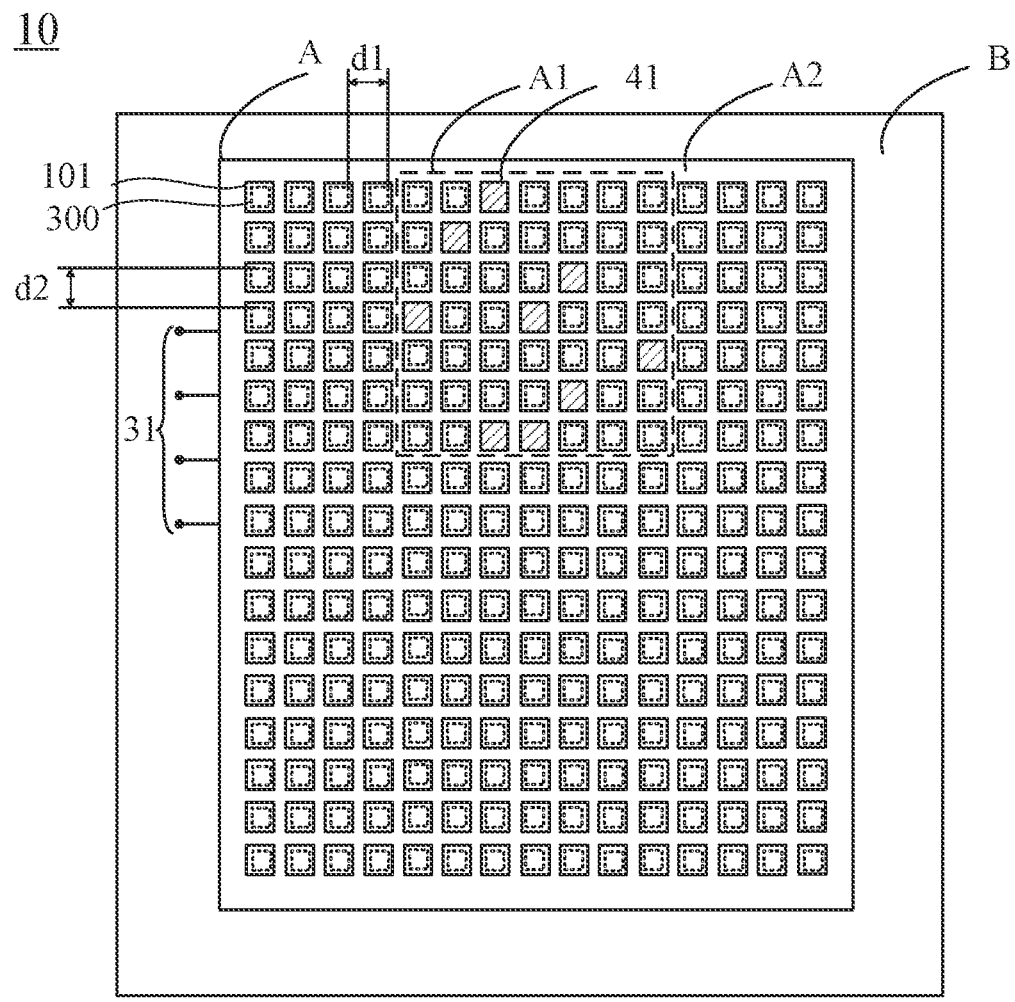
FIG. 2 is a structural diagram of a display panel, in accordance with embodiments of the present disclosure.

In some embodiments of the present disclosure, as shown in FIG. 2, the display panel 10 has a display region A and a bezel region B located on a periphery of the display region. The bezel region B is located on at least one side of the display region A. For example, the bezel region B may be arranged around the display region A.

For example, the display panel includes a plurality of pixel driving circuits and a plurality of light-emitting devices L. Each light-emitting device L is coupled to a pixel driving circuit to form a light-emitting sub-pixel, and the pixel driving circuit is configured to drive the light-emitting device L to emit light.

For example, a plurality of light-emitting sub-pixels include a first type of light-emitting sub-pixels, a second type of light-emitting sub-pixels and a third type of light-emitting sub-pixels. Light-emitting sub-pixels of the same type have the same light-emitting color, and light-emitting sub-pixels of different types have different light-emitting colors. For example, referring to FIG. 3, each light-emitting sub-pixel 101 may emit one of the three primary colors of light. Then, the first type of light-emitting sub-pixels may be red light-emitting sub-pixels 101-R, the second type of light-emitting sub-pixels may be green light-emitting sub-pixels 101-G, and the third type of light-emitting sub-pixels may be blue light-emitting sub-pixels 101-B.

For example, the light-emitting device L may be a light-emitting device including a light-emitting diode (LED), an organic light-emitting diode (OLED) or a quantum dot light-emitting diode (QLED). Based on the foregoing embodiments, the display panel is the OLED display panel, and thus the light-emitting device L is an OLED device. A plurality of OLED devices may be disposed in the display panel 10. Since the OLED device may realize self-luminescence, a backlight source is not required to be provided in the display device with the plurality of OLED devices.

Figure 4:
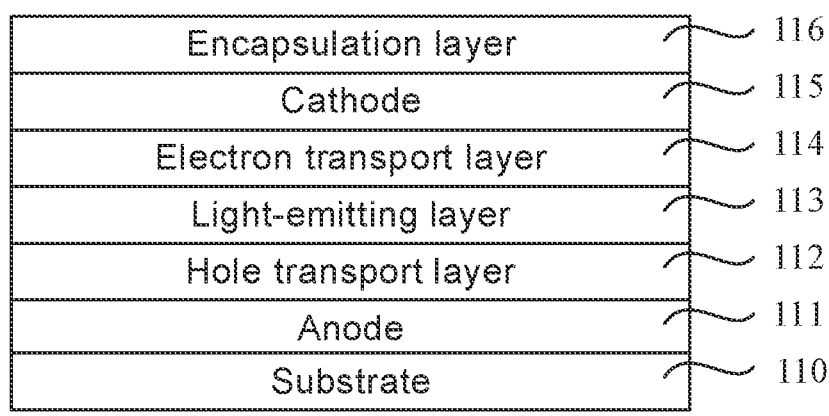
FIG. 4 is a structural diagram of a display panel in accordance with embodiments of the present disclosure.

For example, as shown in FIG. 4, the display panel 10 may include a substrate 110, an anode 111, a hole transport layer (HTL) 112, a light-emitting layer (e.g., an organic light-emitting layer) 113, an electron transport layer (ETL) 114, a cathode 115 and an encapsulation layer 116 that are sequentially arranged. The anode 111, the hole transport layer 112, the light-emitting layer 113, the electron transport layer 114 and the cathode 115 are sequentially stacked on the substrate 110 to form a light-emitting device.

The substrate is configured to carry film layers. The substrate may be a rigid substrate. The rigid substrate may be a glass substrate or a polymethyl methacrylate (PMMA) substrate. For another example, the substrate may be a flexible substrate. The flexible substrate may be a polyethylene terephthalate (PET) substrate, a polyethylene naphthalate two formic acid glycol ester (PEN) substrate or a polyimide (PI) substrate.

A circuit layer may be formed on the substrate, and the circuit layer may include the plurality of pixel driving circuits. The substrate on which the circuit layer is formed may be referred to as a driving backplane. The plurality of light-emitting devices may be disposed on a side of the circuit layer away from the substrate.

For example, the anode may be made of, for example, a transparent conductive material with a high work function. An electrode material of the anode may include indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), and a carbon nanotube. The cathode may be made of, for example, a material with a high conductivity and a low work function. An electrode material of the cathode may include a magnesium aluminum (MgAl) alloy, a lithium aluminum (LiAl) alloy and other alloys, or magnesium (Mg), aluminum (Al), lithium (Li), silver (Ag) and other elemental metals.

For example, a material of the organic light-emitting layer may be selected according to different colors of light emitted from the organic light-emitting layer. For example, the material of the organic light-emitting layer includes a fluorescent light-emitting material or a phosphorescent light-emitting material. For another example, in at least one embodiment of the present disclosure, a doping system may be used in the organic light-emitting layer. That is, a dopant material is mixed into a host light-emitting material to obtain a usable light-emitting material. For example, the host light-emitting material may be a metal compound material, a derivative of anthracene, an aromatic diamine compound, a triphenylamine compound, an aromatic triamine compound, a biphenyldiamine derivative, or a triarylamine polymer. In a case where a type of the material of the organic light-emitting layer is different, a color of the light emitted from the organic light-emitting layer is different, so that a light-emitting color of a corresponding sub-pixel is different.

Figure 3:
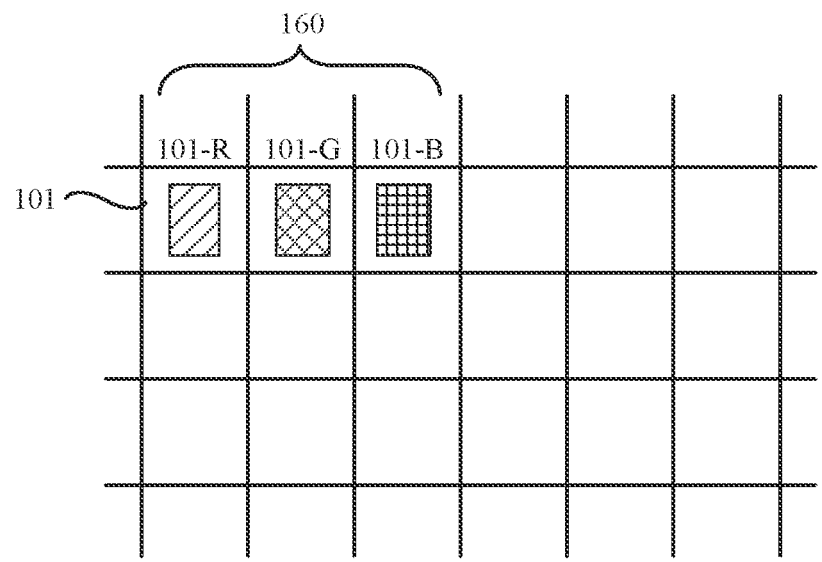
FIG. 3 is a structural diagram of a light-emitting pixel of a display panel, in accordance with embodiments of the present disclosure.

For example, light-emitting sub-pixels (e.g., three) with different light-emitting colors may constitute a pixel. The display panel may include a plurality of pixels located in the display region. For example, the plurality of pixels may be arranged in a plurality of rows and a plurality of columns. For example, referring to FIG. 3, in the display panel, three adjacent light-emitting sub-pixels 101 with different light-emitting colors constitute a light-emitting pixel 160. For example, as shown in FIG. 3, a red light-emitting sub-pixel 101-R, a green light-emitting sub-pixel 101-G and a blue light-emitting sub-pixel 101-B that are adjacent may constitute a light-emitting pixel 160.

For example, referring to FIG. 4 again, when a voltage is applied to the anode 111 and the cathode 115, electrons in the cathode 115 move to the light-emitting layer 113 through the electron transport layer 114 due to an action of the voltage, holes in the anode 111 move to the light-emitting layer 113 through the hole transport layer 112 due to the action of the voltage, and the electrons and the holes are combined in the light-emitting layer 113 to emit light, so as to realize the self-luminescence. In addition, by adjusting the voltage applied to the anode 111 and the cathode 115 of the OLED device at a different position in the display panel, a light-emitting intensity of the OLED device may be changed, thereby realizing display of a color image.

The encapsulation layer may be used for ensuring a good sealing property inside the OLED device to reduce contact of the OLED device with oxygen and water vapor in an external environment, so that a performance of the OLED device may be kept stable, and a service life of the OLED device may be prolonged.

For example, the substrate and the encapsulation layer may be sealed by an encapsulation glue. For another example, the encapsulation layer may include an inorganic encapsulation layer, an organic encapsulation layer and an inorganic encapsulation layer that are sequentially stacked, which are manufactured on the substrate on which the pixel driving circuits and the light-emitting devices are formed by a film layer manufacturing process, so as to encapsulate the light-emitting devices. The film layer manufacturing process may include, for example, at least one of a vapor deposition process and a spin coating process.

In some embodiments of the present disclosure, referring to FIG. 2, the display region A has first region(s) A1 and a second region A2. There may be one or more first regions A1 in the display region A. For the convenience of description, in the embodiments of the present disclosure, the display region A includes one first region A1 as an example, which is collectively described here, and will not be repeated below.

In addition, a region other than the first region A1 in the display region A is the second region A2. That is, the second region A2 is used only for distinction from the first region A1, and does not mean a specific region in the display region A. Moreover, the first region A1 and the second region A2 in FIG. 2 are only for illustration, and actual sizes of the first region A1 and the second region A2 are not limited.

For example, the display panel includes light-emitting sub-pixels 101 located in the first region A1 and light-emitting sub-pixels 101 located in the second region A2. That is, the display panel 10 includes pixel driving circuits 300 located in the first region A1 and pixel driving circuits located in the second region. A density of the pixel driving circuits in the first region is less than a density of the pixel driving circuits 300 in the second region A2.

As a specific implementation, referring to FIG. 2 again, the display region A of the display panel 10 includes the first region A1 and the second region A2. In the second region A2, the pixel driving circuits 300 are substantially uniformly distributed in row and column directions. That is, a distance d1 between every two adjacent pixel driving circuits 300 in each row (i.e., a distance between a certain point of a pixel driving circuit and a corresponding point of an adjacent pixel driving circuit, e.g., a distance between connection points of two adjacent pixel driving circuits for coupling respective light-emitting devices) is substantially equal, and a distance d2 between every two adjacent pixel driving circuits 300 in each column is substantially equal. According to the density of the pixel driving circuits 300 in the second region A2, the first region A1 has, for example, 7 by 7 positions in FIG. 2 where the pixel driving circuits 300 are able to be respectively placed. In the 7 by 7 positions, only some positions are each provided with the pixel driving circuit 300, and other positions are not provided with the pixel driving circuit 300, so that the density of the pixel driving circuits 300 in the first region A1 is less than the density of the pixel driving circuits in the second region A2. For example, in FIG. 2, there are 9 positions (each indicated by a block filled with oblique lines) where the pixel driving circuit 300 is not disposed. In the embodiments, such a position where the pixel driving circuit is not disposed may be referred to as a vacancy position.

Many metal wires exist in a pixel driving circuit, and these metal wires have a poor light transmittance, so that a light quantity of the external light transmitted to the under-screen optical sensor through the display panel is small, and the under-screen optical sensor receives insufficient light, which finally affects the function of the under-screen optical sensor. For example, some positions in the first region are not provided with the pixel driving circuit, and a position where the pixel driving circuit is not disposed has a higher light transmittance than a position where the pixel driving circuit is disposed, so that a light transmittance of the first region is improved, and a light transmittance of the display panel is improved. Thus, the first region A1 may also be referred to as a transmittance increase region. Due to the transmittance increase region of the display panel 10, an under-screen optical sensor is able to receive an increased light quantity, so that a function of the under-screen optical sensor is able to be ensured.

In some embodiments, referring to FIG. 2 the pixel driving circuits 300 located in the first region A1 in the display panel 10 are distributed in rows and columns. The number of pixel driving circuits 300 in each row is less than the number of columns of the pixel driving circuits 300 in the first region A1. That is, in the first region A1, there is at least one position in each row where the pixel driving circuit 300 is not disposed.

It can be understood that the distribution of the pixel driving circuits in the rows and columns may be an array distribution, or may be other distribution structures, which is not limited.

For example, referring to FIG. 2, the pixel driving circuits 300 in the first region A1 are not distributed in an array, but are only arranged in the row direction and the column direction. In at least one row, there is at least one position where the pixel driving circuit 300 is not disposed. In at least one column, there is at least one position where the pixel driving circuit 300 is not disposed.

A region in which the pixel driving circuit is not disposed has a higher light transmittance than a region in which the pixel driving circuit is disposed, and a region in which one or at least two adjacent positions in each row are not provided with the pixel driving circuit is referred to as a circuit vacancy region. That is, the circuit vacancy region includes one vacancy position or at least two continuous vacancy positions. Since at least one circuit vacancy region (e.g., a plurality of circuit vacancy regions) exists in each row, the circuit vacancy regions in the first region are distributed more uniformly in the column direction, so that the light transmission of the first region in the column direction is more uniform.

Figure 5:
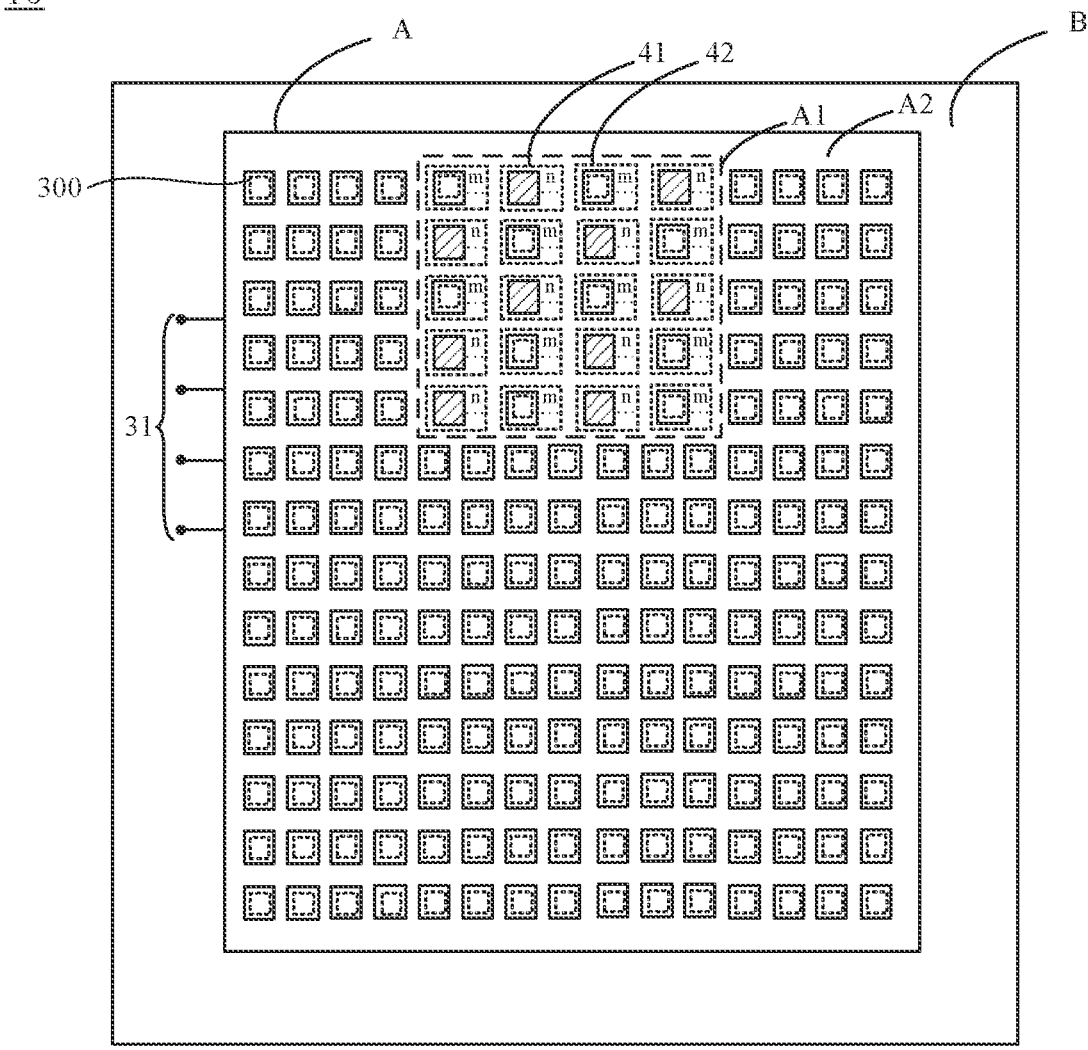
FIG. 5 is a structural diagram of another display panel, in accordance with embodiments of the present disclosure.

For example, referring to FIG. 5, in the first region A1, each row of pixel driving circuits 300 includes a plurality of circuit groups 42, each circuit group 42 includes m pixel driving circuits 300 that are continuously distributed, and n continuous positions between every two adjacent circuit groups 42 are not provided with the pixel driving circuit 300. Here, m is greater than or equal to 1 (i.e., m≥1), and n is greater than or equal to 1 (i.e., n≥1). That is, each row includes a plurality of circuit vacancy regions 41, and each circuit vacancy region 41 is a region in which n adjacent positions in a row are not provided with the pixel driving circuit 300, and includes n adjacent vacancy positions. Moreover, each row includes the plurality of circuit groups 42, and each circuit group 42 includes m adjacent pixel driving circuits 300. For example, m may be 3, and n may be 2. For another example, m may be 4, and n may be 1. For yet another example, both m and n may be 2, which is not limited. It can be understood that the number of pixel driving circuits included in a circuit group may be the same as or different from the number of pixel driving circuits included in a different circuit group, and the number of vacancy positions included in a circuit vacancy region may be the same as or different from the number of vacancy positions included in a different circuit vacancy region. For the convenience of description, the pixel driving circuits 300 will be described in detail below in an example where m is equal to n and n is equal to 2 (i.e., m=n=2).

Due to the above arrangement, in a same row, the plurality of circuit vacancy regions 41 and the plurality of circuit groups 42 are alternately arranged. That is, each circuit vacancy region 41 is adjacent to at least one circuit group 42 (at most two circuit groups 42). Therefore, in each row in the first region A1, the plurality of circuit vacancy regions 41 and the plurality of circuit groups 42 are arranged at intervals, so that the light transmittance of the display panel 10 in the first region A1 is much improved, and the light transmission of the first region A1 is more uniform, and thus the under-screen optical sensor receives much and uniform light, so as to achieve a better effect.

Figure 12:
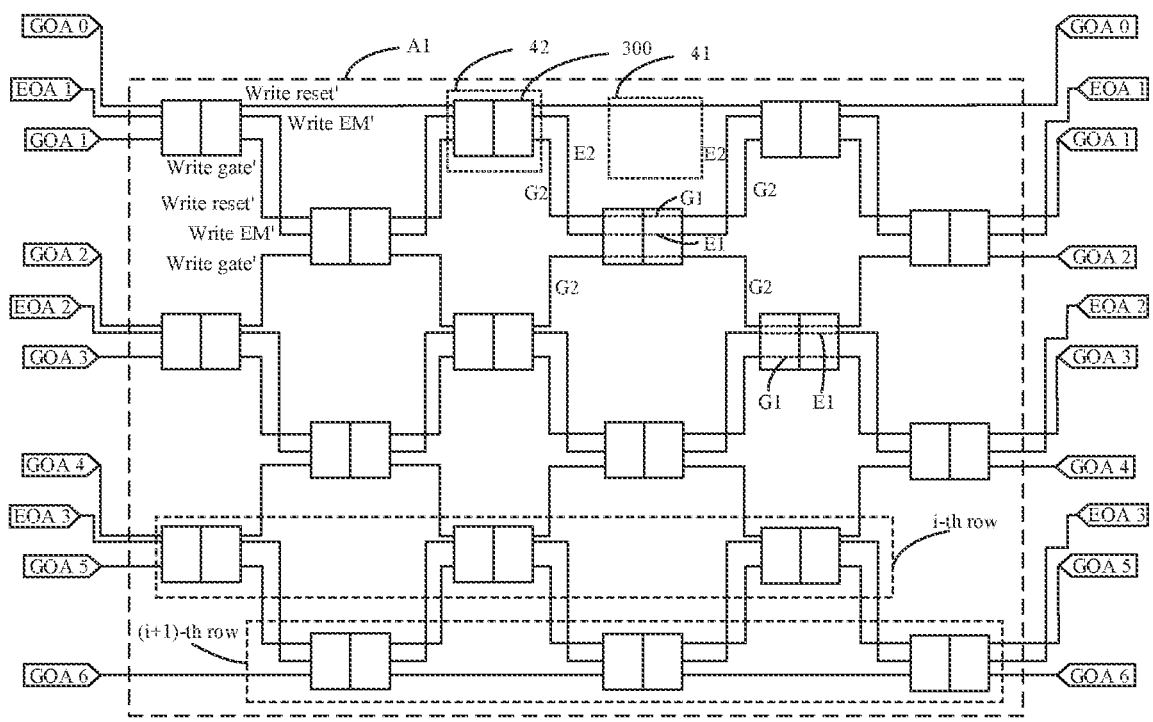
FIG. 12 is a diagram showing yet another connection structure of pixel driving circuits, in accordance with embodiments of the present disclosure.

For example, referring to FIG. 12, pixel driving circuits 300 located in a same column in the first region A1 are respectively distributed in odd-numbered rows, or are respectively distributed in even-numbered rows. That is, in every two adjacent rows, the circuit vacancy regions 41 and the circuit groups 42 are staggered. This means that in every two adjacent rows, a first position to an m-th position of a first row are each provided with the pixel driving circuit, and a first position to an m-th position of a second row are not provided with the pixel driving circuit. Alternatively, in every two adjacent rows, the first position to the m-th position of the first row are not provided with the pixel driving circuit, and the first position to the m-th position of the second row are each provided with the pixel driving circuit. Thus, not only the plurality of circuit vacancy regions and the plurality of circuit groups in each row are alternately arranged, but also the circuit vacancy regions and the circuit groups in each column are alternately arranged, so as to further improve the light transmittance of the first region. Moreover, the light transmission of the first region is more uniform, so that a large local difference of pixels in the first region during display does not occur, and the display of the first region is considered.

In some embodiments of the present disclosure, referring to FIG. 2, the display panel 10 further includes a plurality of driving signal input terminals 31 for driving the plurality of pixel driving circuits 300 in the display panel 10. The driving signal input terminals may include gate signal terminal(s) GOA, control signal terminal(s) EOA, a first voltage terminal VDD, data signal terminal(s) Vdata and an initialization voltage terminal Vinit (i.e., first initialization voltage terminal Vinit below). A type of the driving signal input terminal is related to a type of the pixel driving circuit.

Figure 6:
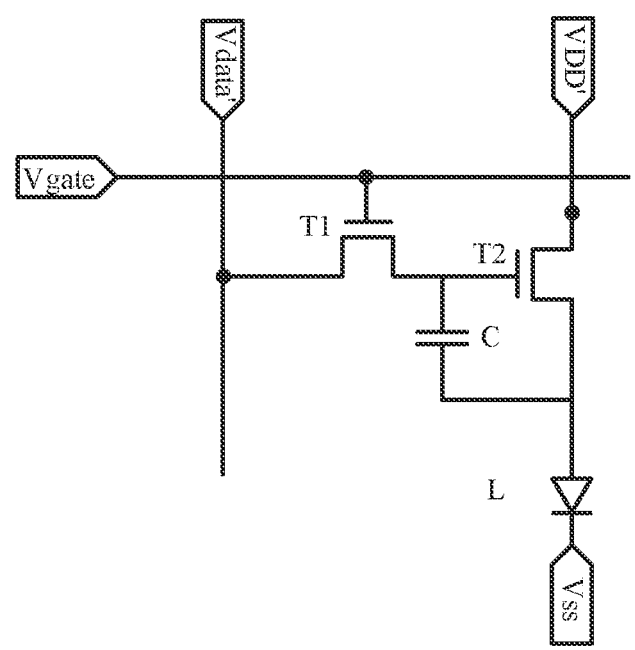
FIG. 6 is a structural diagram of a pixel driving circuit, in accordance with embodiments of the present disclosure.

For example, the pixel driving circuit 300 may be a 2T1C pixel driving circuit including two switching transistors (i.e., a switching transistor T1 and a driving switching transistor T2) and a storage capacitor C shown in FIG. 6. Referring to FIG. 6, driving signals of the 2T1C pixel driving circuit may include a signal of a supply voltage terminal VDD', a signal of a scan signal terminal Vgate and a signal of a data terminal Vdata'.

An operating process of the 2T1C pixel driving circuit shown in FIG. 6 is substantially as follows. When the scan signal terminal Vgate inputs a turned-on signal, the switching transistor T1 is turned on, so that the signal of the data terminal Vdata' is written into the storage capacitor C, and the driving switching transistor T2 is turned on to drive the OLED device to emit light. A driving current corresponds to the signal of the data terminal Vdata', so that a light-emitting brightness of the OLED device is adjusted (that is, a light-emitting brightness of the light-emitting sub-pixel corresponding to the pixel driving circuit is adjusted).

Figure 7:
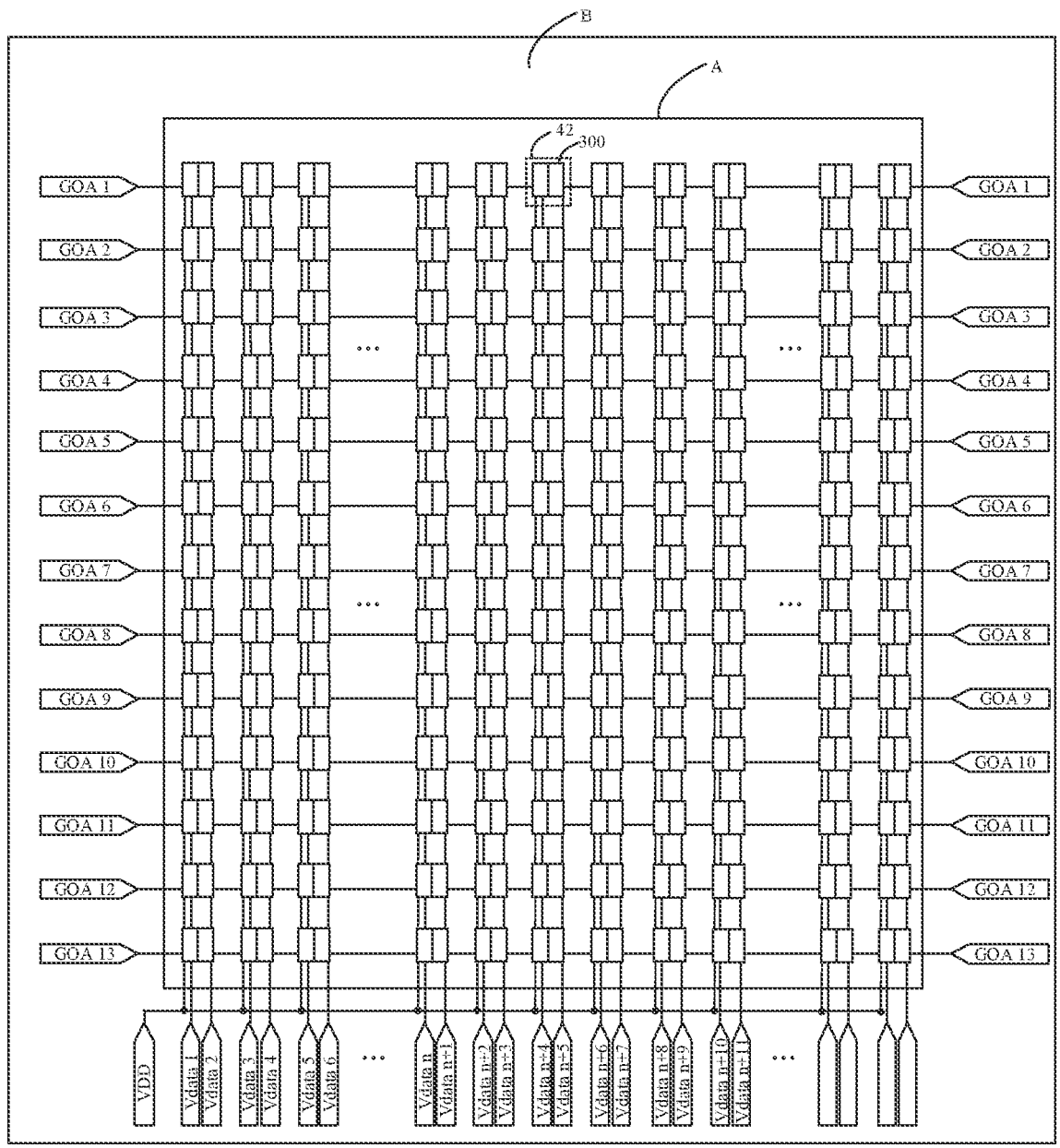
FIG. 7 is a diagram showing a connection structure of pixel driving circuits shown in FIG. 6.

In a case where the pixel driving circuit 300 is the 2T1C pixel driving circuit shown in FIG. 6, a connection structure of the pixel driving circuits in the display panel in the related art may be as shown in FIG. 7. Referring to FIG. 7, the driving signal input terminals may include the first voltage terminal VDD, a plurality of gate signal terminals GOA and a plurality of data signal terminals Vdata.

The first voltage terminal VDD is connected to each pixel driving circuit 300 for providing a supply voltage signal to each pixel driving circuit 300. Referring to FIG. 7, each gate signal terminal GOA is connected to pixel driving circuits 300 in a row.

The plurality of gate signal terminals GOA may be used for providing signals to the scan signal terminals Vgate in the plurality of pixel driving circuits 300. The plurality of data signal terminals Vdata may be used for providing data signals to the plurality of pixel driving circuits 300. Referring to FIG. 7, pixel driving circuits 300 in a same column may be connected to a same data signal terminal Vdata.

A gate scan driver (not shown in FIG. 7) disposed in the bezel region B may provide the signals of the plurality of gate signal terminals GOA. In addition, an integrated circuit (IC) bonded to the substrate 110 may provide the signals of the plurality of data signal terminals Vdata. A flexible printed circuit (FPC) connected to the IC may provide the signal of the first voltage terminal VDD.

Signal sources of the first voltage terminal VDD, the plurality of gate signal terminals GOA and the plurality of data signal terminals Vdata are exemplarily given above. It can be understood that these driving signal input terminals may also have other signal sources, which is not limited in the embodiments of the present disclosure.

In addition, it will be noted that in FIG. 7 and following drawings related to the connection structure of the pixel driving circuits 300, in order to describe the connection structure of the pixel driving circuits 300 and the driving signal input terminals, relevant portions of the connection structure are emphasized, and do not necessarily conform to an actual scale of the pixel driving circuits 300, which is collectively described here.

Figure 8:
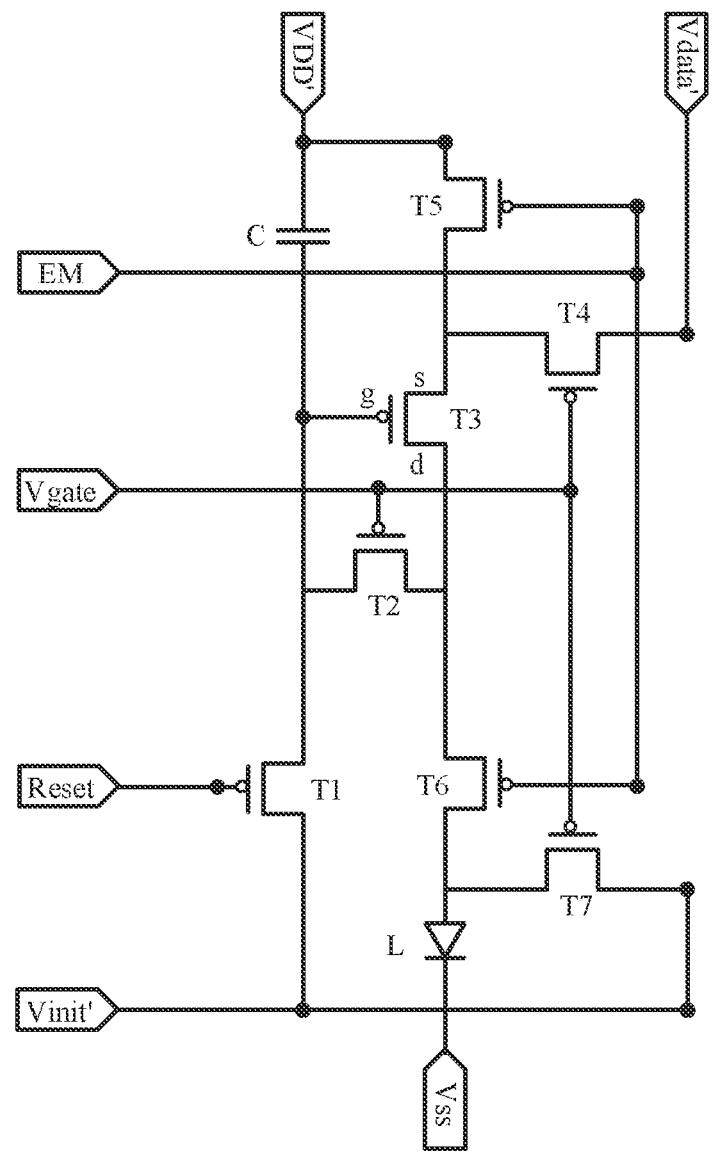
FIG. 8 is a structural diagram of another pixel driving circuit, in accordance with embodiments of the present disclosure.
Figure 16:
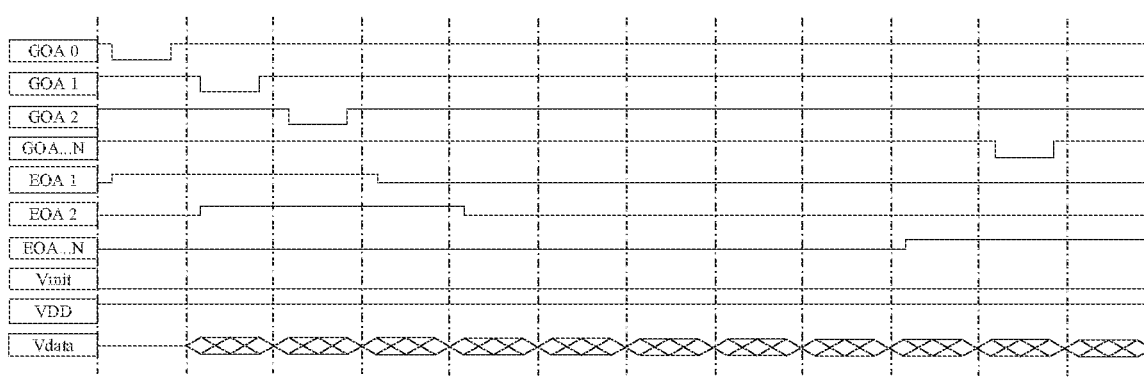
FIG. 16 is a timing diagram of driving signals, in accordance with embodiments of the present disclosure.

In some other implementations, the pixel driving circuit 300 may be more complex. For example, the pixel driving circuit 300 may be a 7T1C pixel driving circuit including seven switching transistors (i.e., a switching transistor T1 to a switching transistor T7) and a storage capacitor C shown in FIG. 8. The switching transistor T3 is a driving switching transistor. Referring to FIG. 8, in addition to the signal of the supply voltage terminal VDD', the signal of the scan signal terminal Vgate and the signal of the data terminal Vdata', driving signals of the 7T1C pixel driving circuit may further include a signal of a reset signal terminal Reset, a signal of a second initialization voltage terminal Vinit' and a signal of an enable signal terminal EM. A timing of the driving signals output from the signal terminals is as shown in FIG. 16.

The switching transistor T1 to the switching transistor T7 may be triodes, thin film transistors or field-effect transistors.

Figure 9:
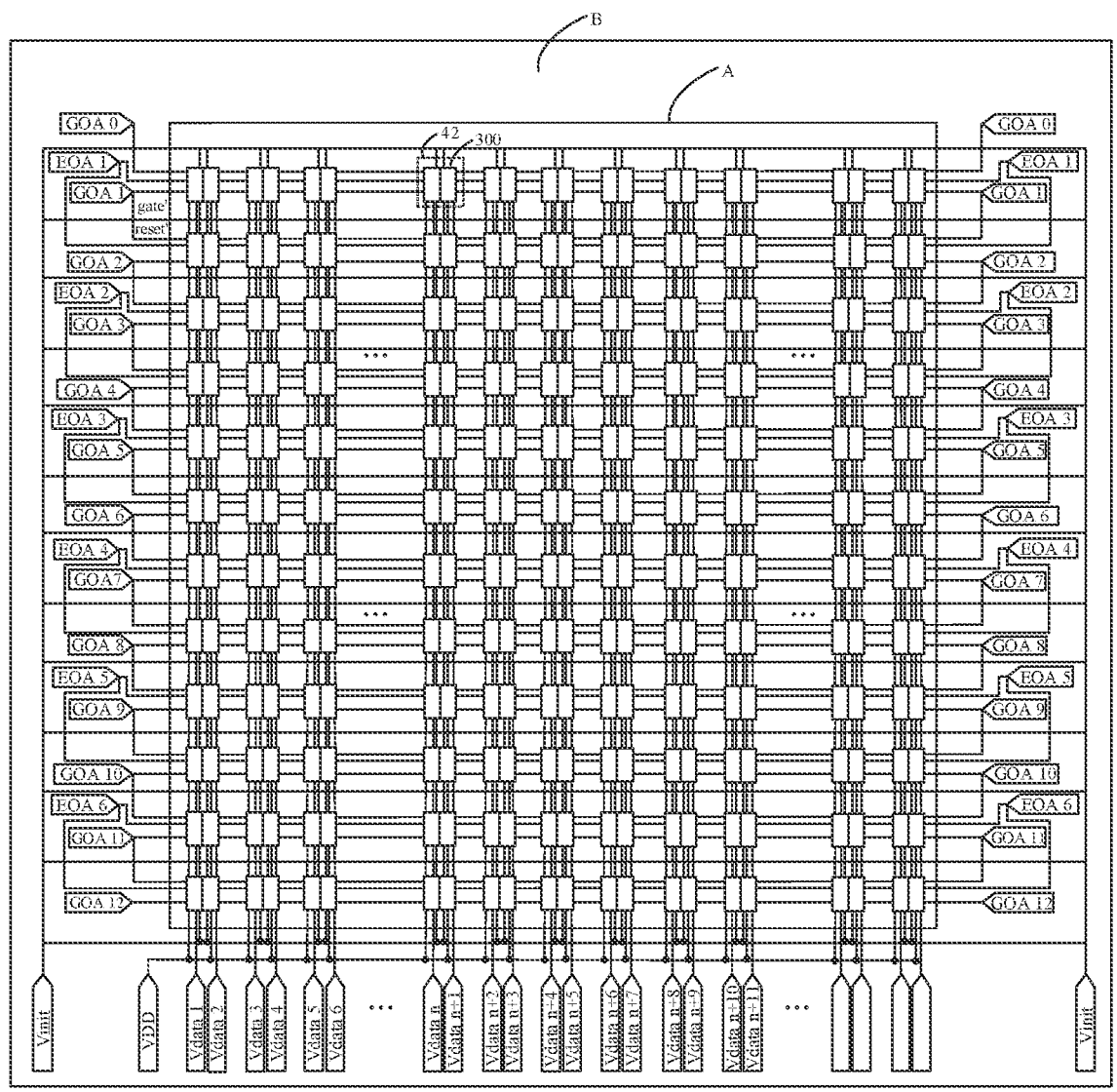
FIG. 9 is a diagram showing a connection structure of pixel driving circuits shown in FIG. 8.

Referring to FIG. 9, the pixel driving circuits 300 in a second row are taken as an example, an operating process of the 7T1C pixel driving circuit shown in FIG. 8 may be substantially divided into three phases.

In a first phase, the reset signal terminal Reset inputs a turned-on signal, so that the switching transistor T1 is turned on, and thus the signal of the second initialization voltage terminal Vinit' is written through the turned-on switching transistor T1 to initialize a gate of the driving transistor (i.e., the switching transistor T3). The signals transmitted by the scan signal terminal Vgate and the reset signal terminal Reset are the same source signals output from the gate signal terminal GOA. Reset signal terminals Reset in a row of pixel driving circuits are connected to the gate signal terminal GOA to which scan signal terminals Vgate in a previous row of pixel driving circuits are connected. For example, the gate signal terminal GOA, which is connected to scan signal terminals Vgate in a first row of pixel driving circuits, provides signals of reset signal terminals Reset in a second row of pixel driving circuits 300.

In a second phase, the scan signal terminal Vgate inputs a turned-on signal, so that the switching transistor T2, the switching transistor T4 and the switching transistor T7 are turned on. The turned-on switching transistor T2 causes the switching transistor T3 to form a diode structure, and the signal of the data terminal Vdata' is written into a first electrode s of the switching transistor T3 through the turned-on switching transistor T4. The storage capacitor C charges the gate g of the switching transistor T3 through the diode structure. In addition, the gate signal terminal GOA provides the turned-on signal of the scan signal terminal Vgate, and a potential of the anode of the OLED device is reset by the signal of the second initialization voltage terminal Vinit' through the turned-on switching transistor T7.

In a third phase, the enable signal terminal EM inputs a turn-on signal, so that the switching transistor T5 and the switching transistor T6 are turned on. In this case, a potential of the first electrode s of the switching transistor T3 is a potential of the supply voltage terminal VDD'. A driving current flows to the OLED device through the turned-on switching transistor T6 to drive the OLED device to emit light. The control signal terminal EOA provides the turned-on signal of the enable signal terminal EM.

For example, in a case where the pixel driving circuit 300 is the 7T1C pixel driving circuit shown in FIG. 8, a connection structure of the pixel driving circuits in the display panel in the related art may be as shown in FIG. 9, and the timing of the driving signals of the display panel is as shown in FIG. 16. Referring to FIG. 9, in addition to the first voltage terminal VDD, the plurality of gate signal terminals GOA and the plurality of data signal terminals Vdata, the driving signal input terminals further include a plurality of control signal terminals EOA and the first initialization voltage terminal Vinit.

The first voltage terminal VDD is connected to each pixel driving circuit 300 for providing the supply voltage signal to each pixel driving circuit 300.

In some embodiments, the display panel further includes at least one first signal line and/or at least one second signal line. Pixel driving circuits located in two adjacent rows are connected in sequence through a first signal line according to an arrangement sequence of the pixel driving circuits located in the two adjacent rows in the row direction. Pixel driving circuits located in two adjacent columns are connected in sequence through a second signal line according to an arrangement sequence of the pixel driving circuits located in the two adjacent columns in the column direction. Pixel driving circuits connected to a same second signal line are alternately distributed in odd-numbered rows and even-numbered rows. That is, the first signal line sequentially connects the pixel driving circuits that are distributed in the row direction, and the second signal line sequentially connects the pixel driving circuits that are distributed in the column direction. In combination with the above embodiments, the first signal lines may be used for connecting the plurality of gate signal terminals GOA in the display panel to the scan signal terminals Vgate and the reset signal terminals Reset in the pixel driving circuits, and for connecting the plurality of control signal terminals EOA in the display panel to the enable signal terminals EM in the pixel driving circuits. The second signal lines may be used for connecting the first voltage terminal VDD in the display panel to the supply voltage terminals VDD' in the pixel driving circuits, and for connecting the data signal terminals Vdata in the display panel to the data terminals Vdata' in the pixel driving circuits.

For example, according to an arrangement sequence of pixel driving circuits in an i-th row and an (i+1)-th row in the row direction, an (i+1)-th gate signal terminal, scan signal terminals in the i-th row of pixel driving circuits, and reset signal terminals in the (i+1)-th row of pixel driving circuits are connected in sequence through a first signal line, and i is greater than or equal to 1 (i.e., i≥1). For example, referring to FIG. 9, the (i+1)-th gate signal terminal GOA is connected to the scan signal terminals Vgate in the i-th row of pixel driving circuit 300 through a first signal line, and an i-th gate signal terminal GOA is connected to the reset signal terminals Reset in the i-th row of pixel driving circuits 300 through a first signal line, and i is greater than or equal to 1 (i.e., i≥1). The gate signal terminal GOA is used for providing reset signals of the reset signal terminals Reset and scan signals of the scan signal terminals Vgate in the pixel driving circuits 300. As shown in FIG. 9, scan signal terminals Vgate in the first row of pixel driving circuits 300 are connected to a second gate signal terminal GOA1 through a first signal line, and reset signal terminals Reset in the first row of pixel driving circuits 300 are connected to a first gate signal terminal GOA0 through a first signal line. Scan signal terminals Vgate in the second row of pixel driving circuits 300 are connected to a third gate signal terminal GOA2 through a first signal line, and reset signal terminals Reset in the second row of pixel driving circuits 300 are connected to the second gate signal terminal GOA1 through a first signal line. By analogy, the description will not be repeated below.

That is, as shown in FIG. 9, each gate signal terminal GOA is connected to the pixel driving circuits 300 in the two adjacent rows. Each gate signal terminal GOA may provide the scan signal of the scan signal terminal Vgate to the pixel driving circuits in the first row of the two adjacent rows, and may provide the reset signal of the reset signal terminal Reset to the pixel driving circuits in the second row of the two adjacent rows, which is beneficial to simplifying the wiring of the circuits.

In addition, it will be noted that referring to FIG. 9, each gate signal terminal GOA is connected to the pixel driving circuits 300 in the two adjacent rows here, which means that the gate signal terminal GOA (i.e., corresponding to the GOA0 shown in FIG. 9) that provides only the reset signal of the reset signal terminal Reset to the pixel driving circuits in the first row and the date signal terminal GOA (i.e., corresponding to the GOA12 shown in FIG. 9) that provides only the scan signal of the scan signal terminal Vgate to pixel driving circuits in a last row should be excluded.

For example, in a case where i is an odd number, enable signal terminals in the i-th row of pixel driving circuits are connected to an (i+1)/2-th control signal terminal. In a case where i is an even number, the enable signal terminals in the i-th row of pixel driving circuits are connected to an i/2-th control signal terminal. For example, referring to FIG. 9, in the case where i is an odd number, the (i+1)/2-th control signal terminal EOA is connected to the enable signal terminals EM in the i-th row of pixel driving circuits through a first signal line. In the case where i is an even number, the i/2-th control signal terminal EOA is connected to the enable signal terminals EM in the i-th row of pixel driving circuits through a first signal line. The control signal terminal EOA is used for providing an enable signal EM' of the enable signal terminal EM to the pixel driving circuits 300. As shown in FIG. 9, a first control signal terminal EOA1 is connected to enable signal terminals EM in the first row of pixel driving circuits through a first signal line, and is connected to enable signal terminals EM in the second row of pixel driving circuits through a first signal line. A second control signal terminal EOA2 is connected to enable signal terminals EM in a third row of pixel driving circuits through a first signal line, and is connected to enable signal terminals EM in a fourth row of pixel driving circuits through a first signal line. By analogy, the description will not be repeated below.

In addition, the plurality of data signal terminals Vdata may be used for providing data signals to the plurality of pixel driving circuits 300. Referring to FIG. 9, pixel driving circuits 300 in a same column may be connected to a same data signal terminal Vdata.

As described above, the gate scan driver (not shown in FIG. 9) disposed in the bezel region B may provide the signals of the plurality of gate signal terminals GOA. The IC (not shown in FIG. 9) bonded to the substrate 110 may provide the signals of the plurality of data signal terminals Vdata. The FPC (not shown in FIG. 9) connected to the IC may provide the signal of the first voltage terminal VDD.

In addition, an emission driver (not shown in FIG. 9) disposed in the bezel region B may provide the signals of the plurality of control signal terminals EOA. The IC (not shown in FIG. 9) bonded to the substrate 110 may also provide the signal of the first initialization voltage terminal Vinit.

Similarly, signal sources of the first voltage terminal VDD, the plurality of gate signal terminals GOA, the plurality of data signal terminals Vdata, the plurality of control signal terminal and the first initialization voltage terminal Vinit are exemplarily given above. It can be understood that these driving signal input terminals may also have other signal sources, which is not limited in the embodiments of the present disclosure.

In the related art shown in FIGS. 7 and 9, all sub-pixels in the display region A are light-emitting sub-pixels. That is, all sub-pixels each include the pixel driving circuit.

In addition, it will be noted that for exemplary purposes, in FIG. 7 or 9, the connection structure of the pixel driving circuits in the related art is described considering the 2T1C pixel driving circuit or the 7T1C pixel driving circuit as example. However, the application scope of the embodiments of the present disclosure is not limited to the 2T1C pixel driving circuit or the 7T1C pixel driving circuit, and other types of pixel driving circuits that are driven by the signals of the above driving signal input terminals should also be included in the scope of the present disclosure.

Since there are many driving signal input terminals for driving the 7T1C pixel driving circuits, a connection structure of the pixel driving circuits in the display panel provided in the embodiments of the present disclosure will be described below considering the 7T1C pixel driving circuits as an example.

It can be understood that in the 2T1C pixel driving circuits or other types of pixel driving circuits that are driven by a small number of driving signal input terminals, part of the driving signal input terminals for driving the 7T1C pixel driving circuits may be included. A connection structure between the part of the driving signals input terminals and these pixel driving circuits may be similar to a connection structure between the part of the driving signal input terminals and the 7T1C pixel driving circuits. Therefore, only the connection structure of the 7T1C pixel driving circuits provided in the embodiments of the present disclosure will be described below, and the connection structure of other pixel driving circuits may be referred to the connection structure of the 7T1C pixel driving circuits, which will not be repeated.

In order to improve the light transmittance of the display panel, based on the connection structure of the pixel driving circuits shown in FIG. 9, pixel driving circuits in some sub-pixels in the first region A1 of the display region A may be removed, so that the density of the pixel driving circuits in the first region A1 is less than the density of the pixel driving circuits in the second region A2. That is, at least one circuit vacancy region is generated, so that the display panel may exhibit the distribution of the pixel driving circuits shown in FIG. 10.

Figure 10:
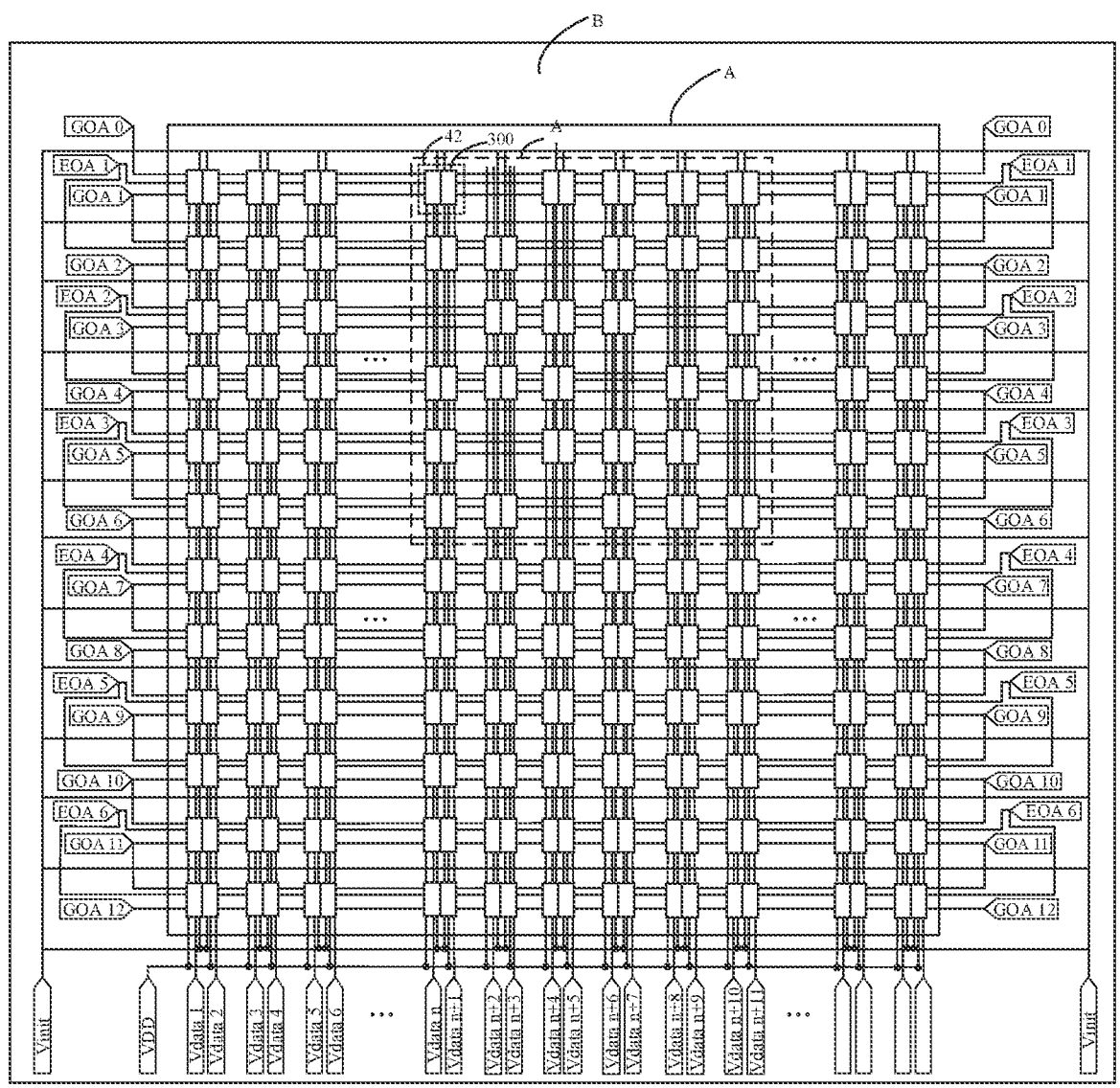
FIG. 10 is a diagram showing a connection structure of pixel driving circuits, in accordance with embodiments of the present disclosure.

After the pixel driving circuits in some sub-pixels in the first region A1 of the display region A are removed (i.e., the first region A1 includes at least one circuit vacancy region), the connection structure of the pixel driving circuits may be as shown in FIG. 10. It can be seen according to FIG. 10 that the first region A1 includes at least one circuit vacancy region 41, so that the light transmittance of the first region A1 is significantly improved.

In order to further improve the light transmittance of the first region A1, part of the pixel driving circuits 300 in each row of sub-pixels in the first region A1 may be removed in units of circuit groups 42, so that each row of pixel driving circuits includes the plurality of circuit groups 42, and each circuit group includes m pixel driving circuits 300 that are sequentially distributed. Moreover, the circuit groups 42 are arranged at intervals, and n continuous positions between two adjacent circuit groups 42 are not provided with the pixel driving circuit. That is, in each row of sub-pixels, the circuit vacancy regions and the circuit groups are arranged at intervals. Thus, the display panel may exhibit the distribution of the sub-pixels shown in FIG. 5, so that the light transmittance of the display panel 10 in the first region A1 is much improved, and the light transmission of the first region A1 is more uniform.

Still further, in some embodiments, pixel driving circuits located in a same column in the first region are respectively distributed in odd-numbered rows or even-numbered rows. For example, referring to FIG. 11, in every two adjacent rows, the circuit groups 42 are staggered.

Figure 11:
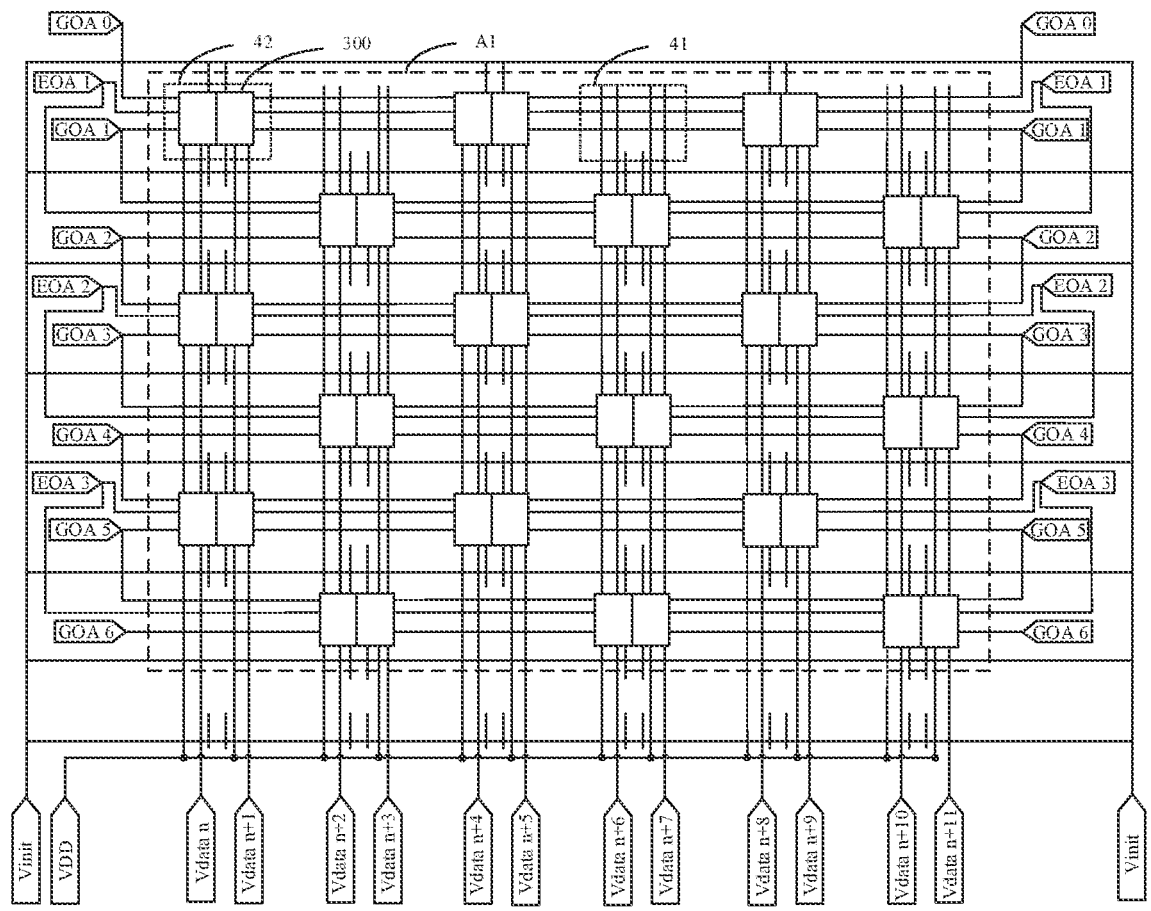
FIG. 11 is a diagram showing another connection structure of pixel driving circuits, in accordance with embodiments of the present disclosure.

For the convenience of description, FIG. 11 and subsequent drawings only illustrate the connection structure of the pixel driving circuits in the first region A1 (i.e., the connection structure of the pixel driving circuits in the second region A2 is omitted).

As shown in FIG. 11, the circuit vacancy regions 41 and the circuit groups 42 are staggered, which is able to improve the light transmittance of the first region A1 of the display region to a greater extent. Moreover, since the distribution of the circuit vacancy regions 41 and the circuit groups 42 is very uniform, the large local difference of pixels in the first region A1 during display does not occur, and thus the display of the first region is considered.

Since FIG. 11 illustrates the connection structure of the pixel driving circuits 300 in the example where m is equal to n and n is equal to 2 (i.e., m=n=2), the circuit vacancy regions 41 and the circuit groups 42 are staggered in FIG. 11, which means that half of the first region A1 is the circuit vacancy regions 41. That is, an occupancy ratio of the pixel driving circuits 300 in the first region A1 is 50%, so that the light transmittance of the first region A1 of the display region is further improved.

Referring to FIG. 11, it can be seen that after the pixel driving circuits in some sub-pixels in the first region A1 of the display region A are removed, some metal wirings still exist at positions where the pixel driving circuits are removed.

In some embodiments of the present disclosure, in order to further improve the light transmittance of the first region A1, a connection structure of the pixel driving circuits may be improved.

For example, a connection structure of pixel driving circuits that are connected to a same gate signal terminal GOA may be improved.

For example, according to the arrangement sequence of the pixel driving circuits in the i-th row and the (i+1)-th row in the row direction, the scan signal terminals in the i-th row of pixel driving circuits and the reset signal terminals in the i+1-th row of pixel driving circuits are connected in sequence through a first signal line, and i is greater than or equal to 1 (i.e., i≥1).

For example, referring to FIG. 12, according to the arrangement sequence of the pixel driving circuits 300 in the i-th row and the (i+1)-th row in the row direction, the (i+1)-th gate signal terminal GOA, the scan signal terminals Vgate in the i-th row of pixel driving circuits 300 and the reset signal terminals Reset in the (i+1)-th row of pixel driving circuits 300 are connected in sequence through a plurality of first gate signal connection segments G1 and a plurality of second gate signal connection segments G2. The plurality of first gate signal connection segments G1 and the plurality of second gate signal connection segments G2 for sequentially connecting the pixel driving circuits 300 in two adjacent rows form the first signal line.

As shown in FIG. 12, according to an arrangement sequence of the pixel driving circuits 300 in the first row and the second row in the row direction, the second gate signal terminal GOA1, the scan signal terminals Vgate in the first row of pixel driving circuits 300, and the reset signal terminals Reset in the second row of pixel driving circuits 300 are connected in sequence through a plurality of first gate signal connection segments G1 and a plurality of second gate signal connection segments G2 in a first signal line. According to an arrangement sequence of the pixel driving circuits 300 in the second row and the third row in the row direction, the third gate signal terminal GOA2, the scan signal terminals Vgate in the second row of pixel driving circuits 300, and the reset signal terminals Reset in the third row of pixel driving circuits 300 are connected in sequence through a plurality of first gate signal connection segments G1 and a plurality of second gate signal connection segments G2 in a first signal line. By analogy, the description will not be repeated below.

Referring to FIG. 12, a first gate signal connection segment G1 includes connection segment(s) located between the pixel driving circuits 300 in each circuit group 42 in the i-th row and the (i+1)-th row of light-emitting sub-pixels.

Referring to FIG. 12, a second gate signal connection segment G2 includes: a connection segment for connecting a scan signal terminal Vgate of a first pixel driving circuit 300 in each circuit group 42 in the i-th row of light-emitting sub-pixels and a reset signal terminal Reset of a pixel driving circuit 300, which is adjacent to the first pixel driving circuit 300 in the row direction, in the (i+1)-th row of light-emitting sub-pixels; or a connection segment for connecting a scan signal terminal Vgate of an m-th pixel driving circuit 300 in each circuit group 42 in the i-th row of light-emitting sub-pixels and a reset signal terminal Reset of a pixel driving circuit 300, which is adjacent to the m-th pixel driving circuit 300 in the row direction, in the (i+1)-th row of light-emitting sub-pixels. FIG. 12 illustrates the connection structure of the plurality of gate signal terminals GOA and the pixel driving circuits 300 in the first region A1 with m=n=2.

That is, each gate signal terminal GOA may provide the scan signal gate' of the scan signal terminal Vgate to the first row of pixel driving circuits in the two adjacent rows of pixel driving circuits connected thereto, and may provide the reset signal reset' of the reset signal terminal Reset to the second row of pixel driving circuits in the two adjacent rows of pixel driving circuits connected thereto. In combination with FIG. 12, it can be seen that in a case where the plurality of gate signal terminals GOA are connected to the pixel driving circuits 300 in the above manner, the pixel driving circuits 300 in each circuit group 42 are connected through the first gate signal connection segment(s) G1, and the pixel driving circuits respectively located in the two adjacent rows and adjacent to each other according to the row direction are connected through the second gate signal connection segment G2.

Therefore, the plurality of gate signal terminals GOA are connected to the pixel driving circuits in the above manner, so that wiring spaces required for connecting the plurality of gate signal terminals GOA to the pixel driving circuits may be saved. That is, wiring spaces required for connecting the plurality of gate signal terminals GOA to the reset signal terminals Reset and the scan signal terminals Vgate in the pixel driving circuits are saved, so that the light transmittance of the first region A1 is further improved.

For example, a connection structure of the pixel driving circuits connected to a same control signal terminal EOA may be improved.

For example, according to the arrangement sequence of the pixel driving circuits in the i-th row and the (i+1)-th row in the row direction, the enable signal terminals in the i-th row of pixel driving circuits and the enable signal terminals in the (i+1)-th row of pixel driving circuits are connected in sequence through a first signal line, and i is greater than or equal to 1 (i.e., i≥1).

Referring to FIG. 12, according to an arrangement sequence of pixel driving circuits 300 in a (2i−1)-th row and a 2i-th row in the row direction, an i-th control signal terminal EOA, enable signal terminals EM in the (2i−1)-th row of pixel driving circuits 300 and enable signal terminals EM in the 2i-th row of pixel driving circuits 300 are connected in sequence through a plurality of first control signal connection segments E1 and a plurality of second control signal connection segments E2. The plurality of first control signal connection segments E1 and the plurality of second control signal connection segments E2 for sequentially connecting the pixel driving circuits 300 in two adjacent rows form a first signal line.

For example, as shown in FIG. 12, according to the arrangement sequence of the pixel driving circuits 300 in the first row and the second row in the row direction, the first control signal terminal EOA1, the enable signal terminals EM in the first row of pixel driving circuits 300, and the enable signal terminals EM in the second row of pixel driving circuits 300 are connected in sequence through a plurality of first control signal connection segments E1 and a plurality of second control signal connection segments E2 in a first signal line. According to an arrangement sequence of the pixel driving circuits 300 in the third row and the fourth row in the row direction, the second control signal terminal EOA2, the enable signal terminals EM in the third row of pixel driving circuits 300, and the enable signal terminals EM in the fourth row of pixel driving circuits 300 are connected in sequence through a plurality of first control signal connection segments E1 and a plurality of second control signal connection segments E2 in a first signal line. By analogy, the description will not be repeated below.

Referring to FIG. 12, a first control signal connection segment E1 includes connection segment(s) located between the pixel driving circuits 300 in each circuit group 42 in a (2i−1)-th row and a 2i-th row of light-emitting sub-pixels.

Referring to FIG. 12, a second control signal connection segment E2 includes: a connection segment for connecting an enable signal terminal EM of a first pixel driving circuit 300 in each circuit group 42 in the (2i−1)-th row of light-emitting sub-pixels and an enable signal terminal EM of a pixel driving circuit 300, which is adjacent to the first pixel driving circuit 300 in the row direction, in the 2i-th row of light-emitting sub-pixels; or a connection segment for connecting an enable signal terminal EM of an m-th pixel driving circuit 300 in each circuit group 42 in the (2i−1)-th row of light-emitting sub-pixels and an enable signal terminal EM of a pixel driving circuit 300, which is adjacent to the m-th pixel driving circuit 300 in the row direction, in the 2i-th row of light-emitting sub-pixels. FIG. 12 illustrates the connection structure of the plurality of control signal terminals EOA and the pixel driving circuits 300 in the first region A1 with m=n=2.

That is, each control signal terminal EOA may provide the enable signal EM' of the enable signal terminal EM to the pixel driving circuits in the adjacent two rows connected thereto. In combination with FIG. 12, it can be seen that in a case where the plurality of control signal terminals EOA are connected to the pixel driving circuits 300 in the above manner, the pixel driving circuits 300 in each circuit group 42 are connected through the first control signal connection segment(s) E1, and the pixel driving circuits 300 respectively located in the two adjacent rows and adjacent to each other according to the row direction are connected through the second control signal connection segment E2.

Therefore, the plurality of control signal terminals EOA are connected to the pixel driving circuits in the above manner, wiring spaces required for connecting the plurality of control signal terminals EOA to the pixel driving circuits may be saved. That is, wiring spaces required for connecting the plurality of control signal terminals EOA to the enable signal terminals EM in the pixel driving circuits are saved, so that the light transmittance of the first region A1 is further improved.

For example, a connection structure of the pixel driving circuits connected to the first voltage terminal VDD may be improved.

For example, according to an arrangement sequence of pixel driving circuits in a j-th column and a (j+1)-th column in the column direction, the first voltage terminal, supply voltage terminals in the j-th column of pixel driving circuits, and supply voltage terminals in the (j+1)-th column of pixel driving circuits are connected in sequence through a second signal line. The supply voltage terminals in the j-th column of pixel driving circuits and the supply voltage terminals in the (j+1)-th column of pixel driving circuits are connected in sequence through a second signal line, and j is greater than or equal to 1 (i.e., j≥1).

Figure 13:
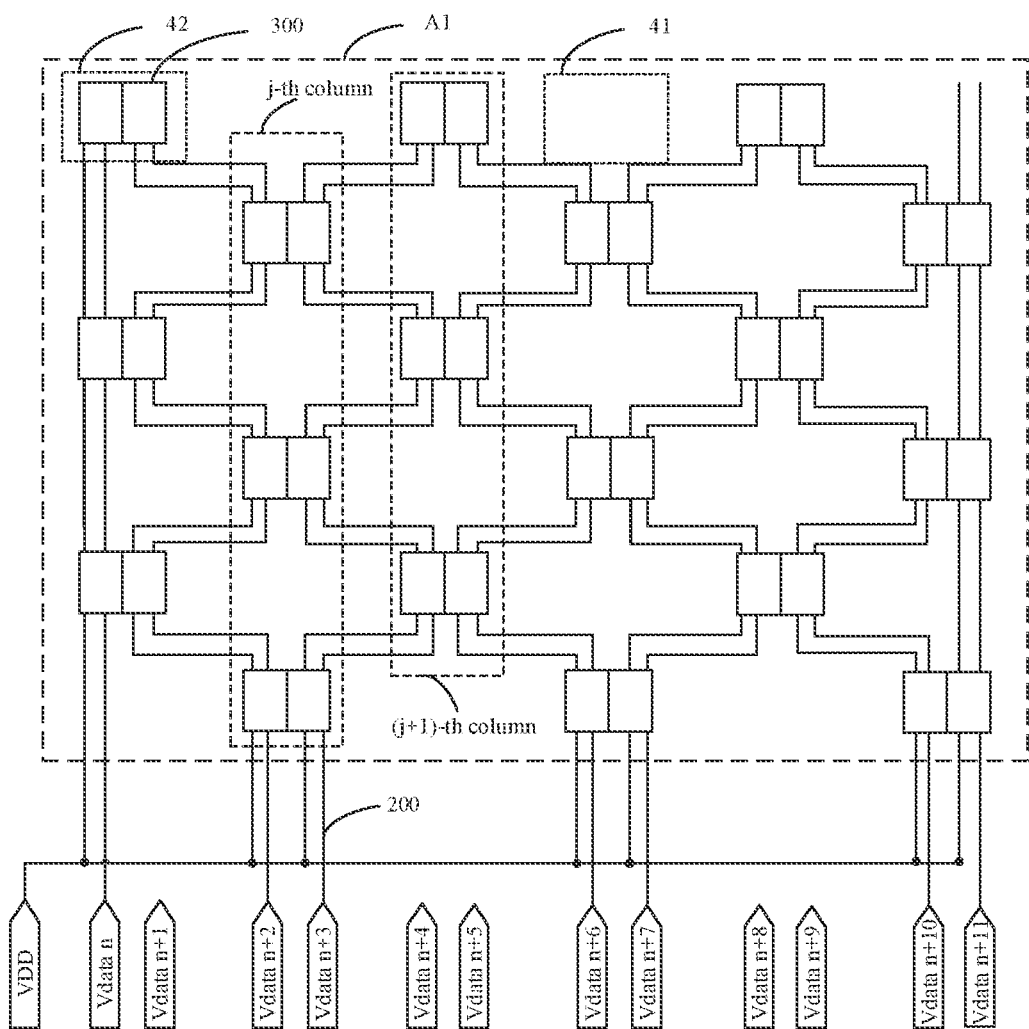
FIG. 13 is a diagram showing yet another connection structure of pixel driving circuits, in accordance with embodiments of the present disclosure.

For example, as shown in FIG. 13, in a case where m is equal to n and n is equal to 2 (i.e., m=n=2), the first voltage terminal VDD is connected to each pixel driving circuit 300. According to an arrangement sequence of pixel driving circuits in a second column and a third column in the column direction, the first voltage terminal VDD, supply voltage terminals in the second column of pixel driving circuits, and supply voltage terminals in the third column of pixel driving circuits are connected in sequence through a second signal line 200. According to an arrangement sequence of pixel driving circuits in a fourth column and a fifth column in the column direction, the first voltage terminal VDD, supply voltage terminals in the fourth column of pixel driving circuits, and supply voltage terminals in the fifth column of pixel driving circuits are connected in sequence through a second signal line 200. By analogy, the description will not be repeated below.

In combination with FIG. 13, it can be seen that in a case where the supply voltage terminals in two adjacent columns of pixel driving circuits 300 are connected in the above manner, the supply voltage signal may be transmitted to two adjacent columns of pixel driving circuits 300 by using one second signal line 200, so that wiring spaces required for connecting the first voltage terminal VDD to the supply voltage terminals VDD' in the pixel driving circuits are saved, and the light transmittance of the first region A1 is further improved.

In addition, it can be seen from FIG. 13 that the above connection structure of the first voltage terminal VDD and the pixel driving circuits 300 illustrates a connection structure of the first voltage terminal VDD and most of the pixel driving circuits 300 in a pixel driving circuit structure. At edges (see FIG. 13, e.g., a first column, a last column and the last row) of the pixel driving circuit structure, the first voltage terminal VDD is directly connected to each of pixel driving circuits 300 located at these edges.

For example, a connection structure of pixel driving circuits connected to a same data signal terminal Vdata may be improved.

For example, according to the arrangement sequence of the pixel driving circuits in the j-th column and the (j+1)-th column in the column direction, a data signal terminal, data terminals in the j-th column of pixel driving circuits, and data terminals in the (j+1)-th column of pixel driving circuits are connected in sequence through a second signal line. The data terminals in the j-th column of pixel driving circuits and the data terminals in the (j+1)-th column of pixel driving circuits are connected in sequence through a second signal line, and j is greater than or equal to 1 (i.e., j≥1).

For example, referring to FIG. 13, a data terminal of a second pixel driving circuit 300 in each circuit group 42 in a j-th column of circuit groups 42 and a data terminal of a first pixel driving circuit 300 in each circuit group 42 in a (j+1)-th column of circuit groups 42 are connected to (j+1)-th data signal terminal Vdata.

For example, as shown in FIG. 13, a data terminal of a second pixel driving circuit 300 of each circuit group 42 in a first column of circuit groups 42 and a data terminal of a first pixel driving circuit 300 of each circuit group 42 in a second column of circuit groups 42 are connected to a second data signal terminal Vdata n+2 through a second signal line 200. A data terminal of a second pixel driving circuit 300 in each circuit group 42 of in the second column of circuit groups 42 and a data terminal of a first pixel driving circuit 300 in each circuit group 42 in a third column of circuit groups 42 are connected to a third data signal terminal Vdata n+3 through a second signal line 200. A data terminal of a second pixel driving circuit 300 in each circuit group 42 in the third column of circuit groups 42 and a data terminal of a first pixel driving circuit 300 in each circuit group 42 in a fourth column of circuit groups 42 are connected to a fourth data signal terminal Vdata n+6 through a second signal line 200. That is, according to the arrangement sequence of the pixel driving circuits 300 in the column direction, a data terminal of each pixel driving circuit 300 in a second column of pixel driving circuits 300 and a data terminal of each pixel driving circuit 300 in a third column of pixel driving circuits 300 are connected in sequence through a second signal line 200. A data terminal of each pixel driving circuit 300 in a fourth column of pixel driving circuits 300 and a data terminal of each pixel driving circuit 300 in a fifth column of pixel driving circuits 300 are connected in sequence through a second signal line 200. By analogy, the description will not be repeated below.

In combination with FIG. 13, it can be seen that in a case where the plurality of data signal terminals are connected to the pixel driving circuits 300 in the above manner, the data signal may be transmitted to two adjacent columns of pixel driving circuits 300 from different circuit groups by using one second signal line 200, so that wiring spaces required for connecting the data signal terminals Vdata to the data terminals Vdata' in the pixel driving circuits 300 are saved, and thus the light transmittance of the first region A1 is further improved.

In addition, it may be seen from FIG. 13 that the above connection structure of the data signal terminals Vdata and the pixel driving circuits 300 illustrates a connection structure of the data signal terminals Vdata and most of the pixel driving circuits 300 in the pixel driving circuit structure. At edges (see FIG. 13, e.g., the first column and the last column) of the pixel driving circuit structure, a data signal terminal Vdata may be connected to a column of pixel driving circuits 300. For example, in FIG. 13, a first data signal terminal Vdata n is connected to a first pixel driving circuit 300 in each circuit group in the first column of circuit groups.

In some embodiments of the present disclosure, the display panel further includes the first initialization voltage terminal Vinit, and the first initialization voltage terminal is connected to each pixel driving circuit.

Figure 14A:
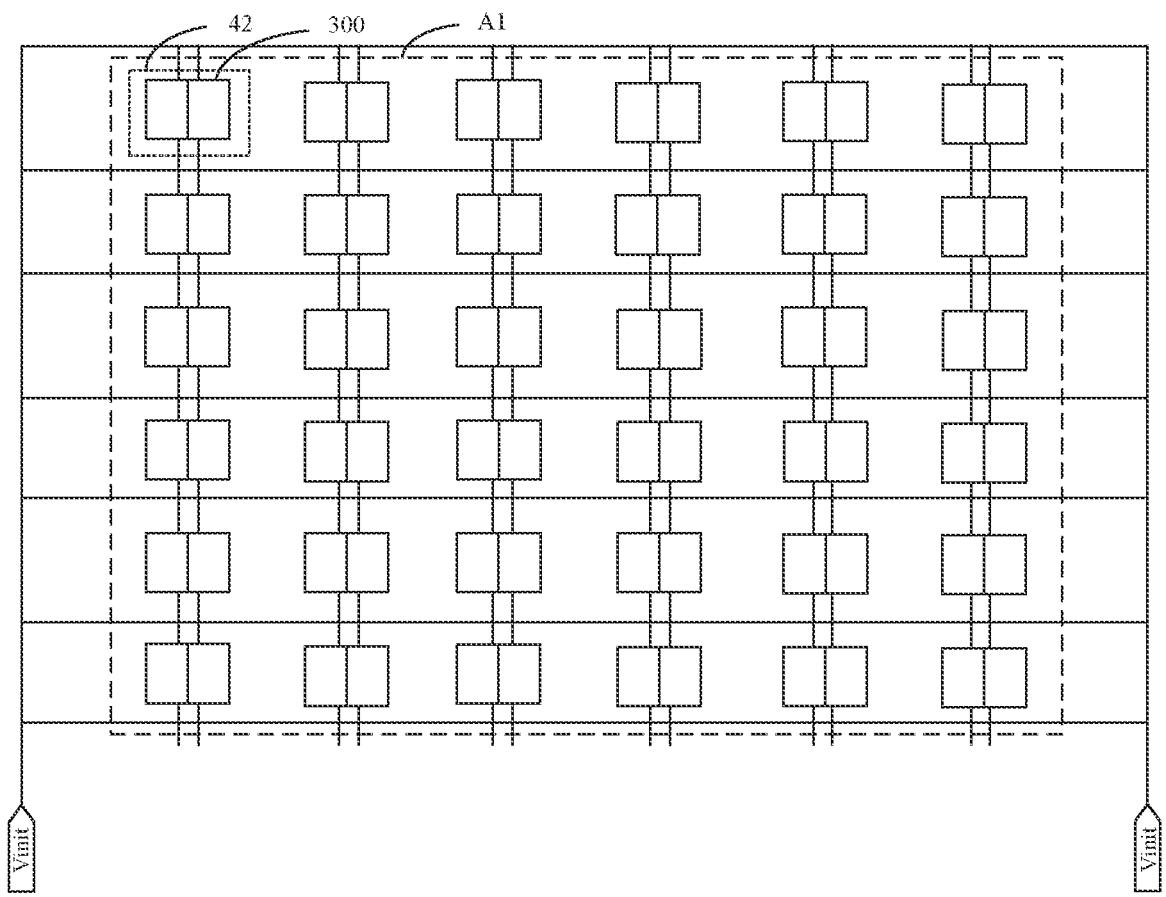
FIG. 14a is a diagram showing a connection structure of pixel driving circuits in accordance with the related art.
Figure 14B:
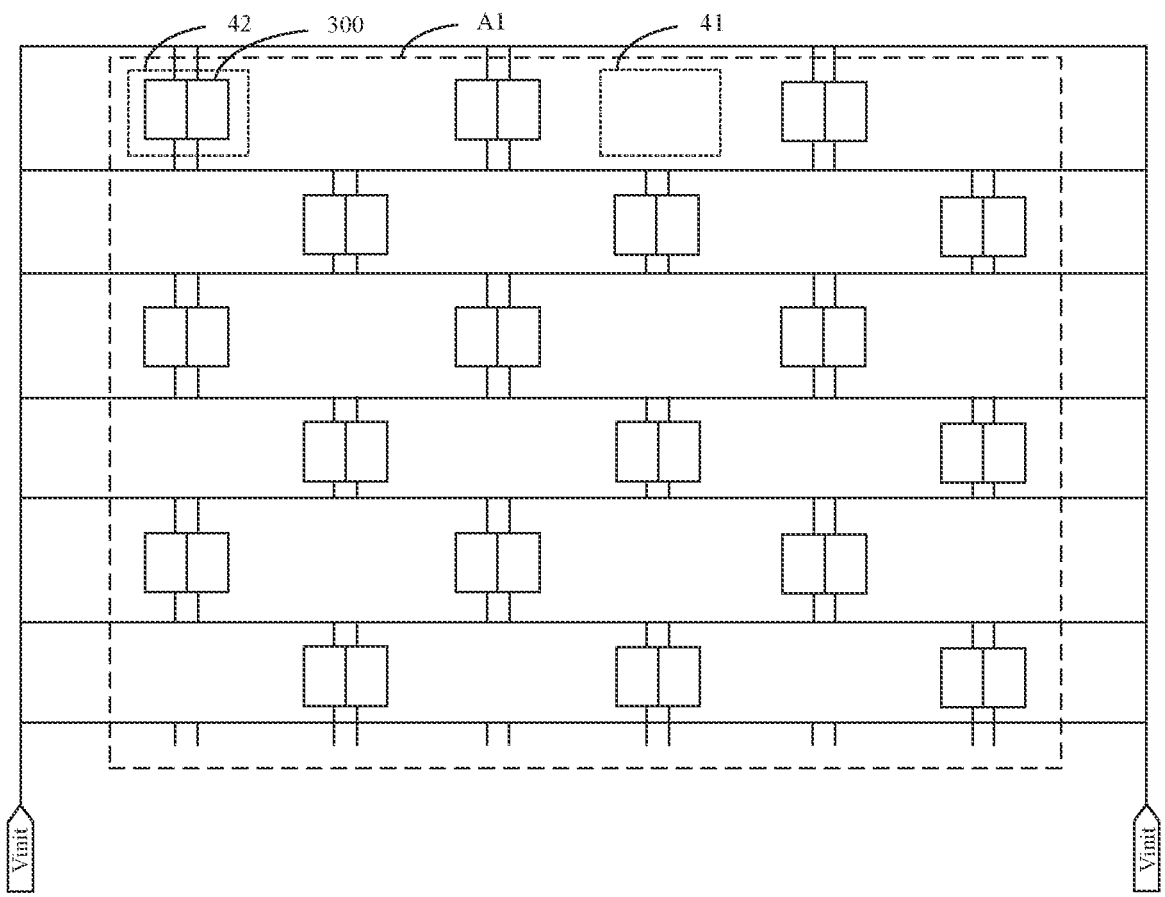
FIG. 14b is a diagram showing yet another connection structure of pixel driving circuits, in accordance with embodiments of the present disclosure.

For example, referring to FIG. 14a, FIG. 14a illustrates a connection structure of the first initialization voltage terminal Vinit and the pixel driving circuits 300 in the related art. Based on FIG. 14a, the connection structure of the first initialization voltage terminal Vinit and the pixel driving circuits 300 may be improved. For example, as shown in FIG. 14b, the embodiments of the present disclosure provide the pixel driving circuit structure in which some of the pixel driving circuits 300 are removed (i.e., the circuit vacancy regions are disposed). That is, connection lines of the removed pixel driving circuits 300 and the first initialization voltage terminal Vinit are removed, so that the light transmittance of the first region A1 is further improved.

The above examples respectively describe the improvements of the connection structure of the pixel driving circuits and the connection structure of the pixel driving circuits and each driving signal input terminal in the embodiments of the present disclosure. Based on the above description, new connection structures of the pixel driving circuits and the driving signal input terminals provided in the embodiments of the present disclosure may be as shown in FIG. 15.

Figure 15:
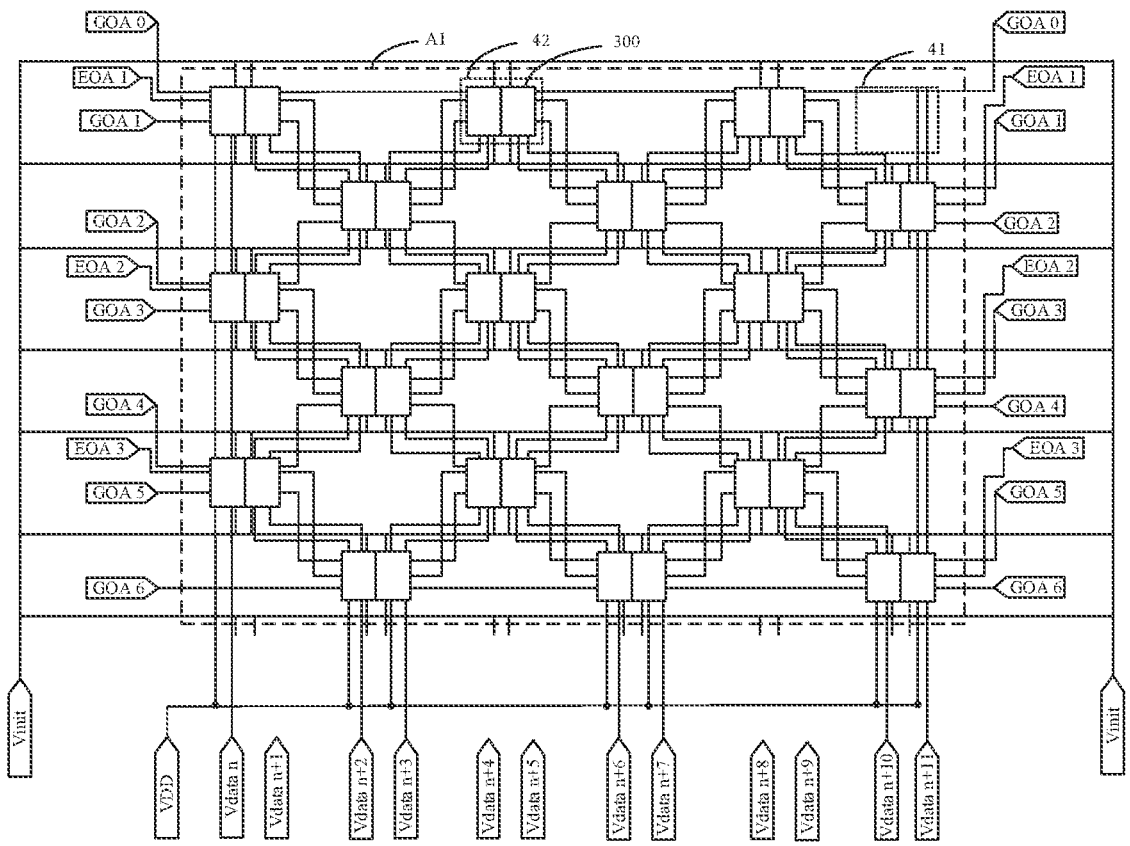
FIG. 15 is a diagram showing yet another connection structure of pixel driving circuits, in accordance with embodiments of the present disclosure.

It can be seen from the foregoing and FIG. 15 that due to the new connection structure of the pixel driving circuits and the new connection structure of the pixel driving circuits and the driving signal input terminals, the metal wirings at the positions (i.e., vacancy positions) where the pixel driving circuits are removed are significantly reduced, so that the light transmittance of the first region A1 is further improved.

Thus, the display panel provided in the embodiments of the present disclosure has the first region A1, and the sub-pixels in each row in the first region A1 include at least one circuit vacancy region formed by the position(s) (i.e., the vacancy position(s)) where the pixel driving circuit(s) are removed, so that the light transmittance of the first region A1 is improved. Moreover, after some pixel driving circuits are removed, the above improvements of the connection structure of the retained pixel driving circuits and the connection structure of the retained pixel driving circuits and the driving signal input terminals are performed in the embodiments of the present disclosure, so that the light transmittance of the first region A1 is significantly improved.

In addition, in some embodiments, the display panel further includes the plurality of light-emitting devices. A light-emitting sub-pixel includes a light-emitting device, and no light-emitting device is disposed in the circuit vacancy region.

That is, in the circuit vacancy region, both the pixel driving circuit(s) and the light-emitting device(s) are removed, so that a light transmittance of the circuit vacancy region is further improved. That is, the light transmittance of the first region A1 of the display panel is further improved.

The light-emitting device may be the OLEO device, or may be another type of light-emitting device capable of being driven by the pixel driving circuit, which is not limited in the embodiments of the present disclosure.

Figure 17:
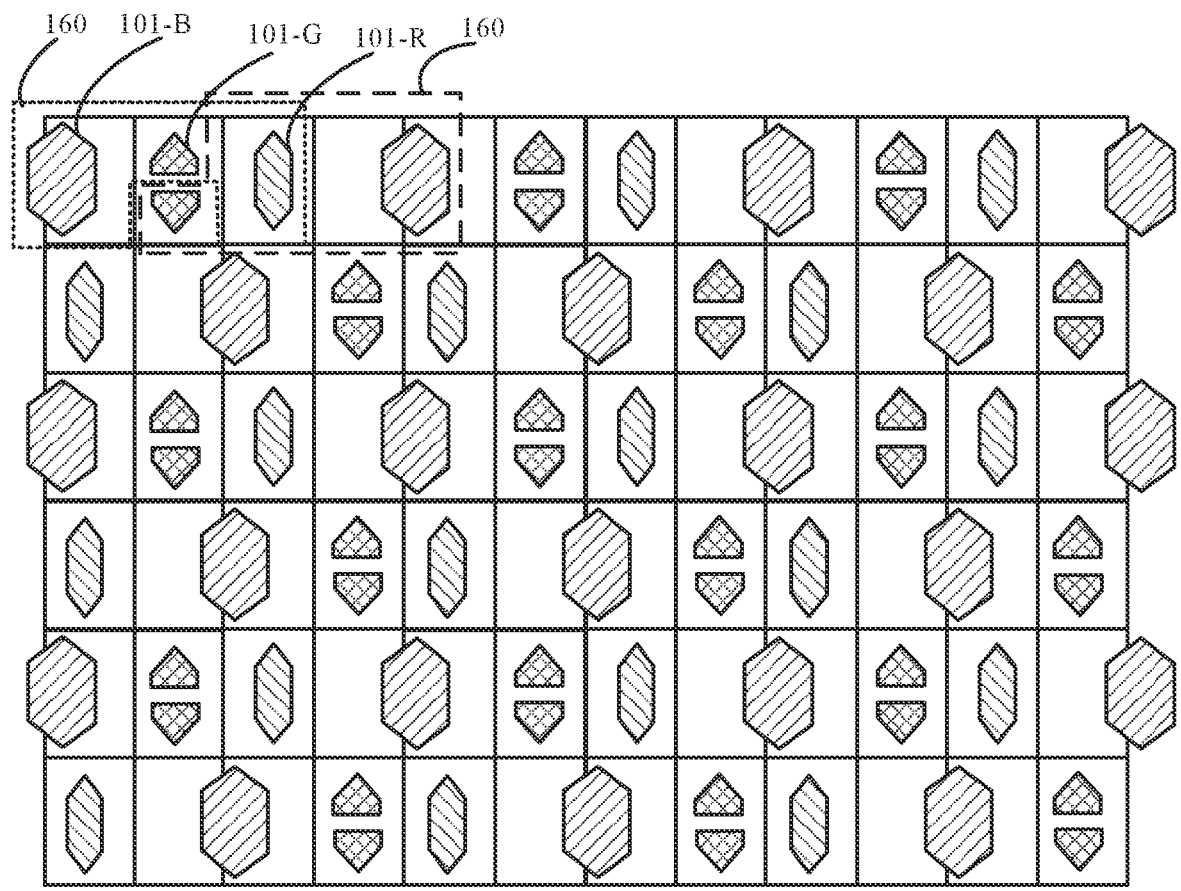
FIG. 17 is a diagram showing a distribution of light-emitting sub-pixels in a display panel in accordance with the related art.

For example, in a display panel, the pixel driving circuits in different types of light-emitting sub-pixels are substantially the same in size, and these pixel driving circuits with substantially the same size may be regularly distributed in rows and columns. For example, referring to FIG. 17, FIG. 17 shows a structure of a display panel in the related art. The pixel driving circuits 300 (i.e., the rectangular blocks in FIG. 17) are regularly distributed in rows and columns.

In addition, since light-emitting devices in different types of light-emitting sub-pixels need to emit different colors of light, and different types of light-emitting devices are different in light-emitting efficiency and service life, in different types of light-emitting sub-pixels, the light-emitting devices are generally different in shape and size. For example, a light-emitting device with a low light-emitting efficiency may be made larger, and a light-emitting device with a high light-emitting efficiency may be made smaller, so as to balance light-emitting conditions of different types of light-emitting devices, so that a normal display is completed. For example, referring to FIG. 17, the green light-emitting sub-pixel 101-G, the blue light-emitting sub-pixel 101-B, and the red light-emitting sub-pixel 101-R have different sizes.

Moreover, since the light-emitting devices driven by different pixel driving circuits 300 may be different in size and shape, the light-emitting devices may not be arranged in an array. As shown in FIG. 17, a light-emitting device in a blue light-emitting sub-pixel 101-B is arranged larger, and a light-emitting device in a green light-emitting sub-pixel 101-G is arranged smaller. Based on this, in order to rationally arrange the light-emitting devices and improve a resolution (i.e., the number of pixels corresponding to a unit area) as much as possible, as shown in FIG. 17, in each light-emitting sub-pixel, the light-emitting device and the pixel driving circuit do not correspond to each other in position. A green light-emitting sub-pixel 101-G, a blue light-emitting sub-pixel 101-B and a red light-emitting sub-pixel 101-R constitute a light-emitting pixel 160. Moreover, two light-emitting pixels 160 share a red light-emitting sub-pixel 101-R.

Figure 18:
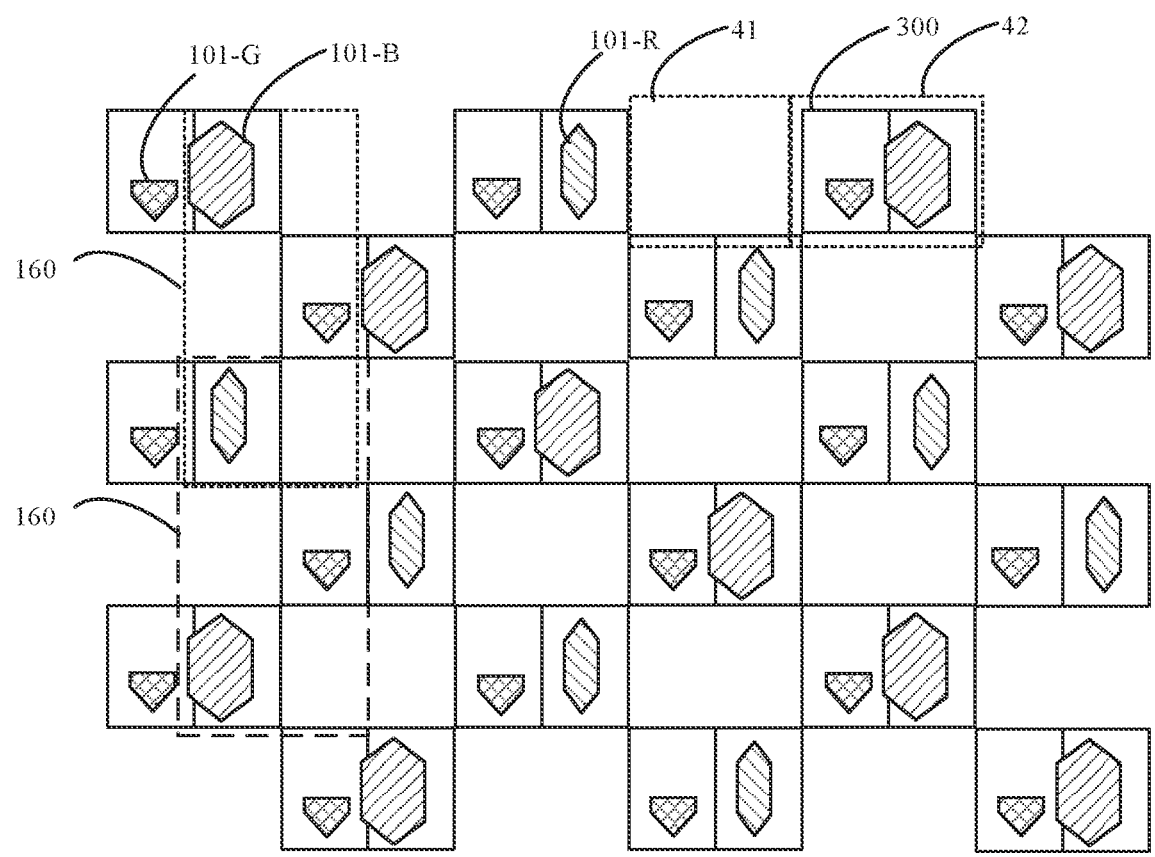
FIG. 18 is a diagram showing a distribution of light-emitting sub-pixels of a display panel, in accordance with embodiments of the present disclosure.

For example, in a case where the circuit vacancy regions and the circuit groups are staggered, and m is equal to n and n is equal to 2 (i.e., m=n=2), light-emitting sub-pixels located in an odd-numbered column in the plurality of light-emitting sub-pixels are first type of light-emitting sub-pixels, and light-emitting sub-pixels located in an even-numbered column in the plurality of light-emitting sub-pixels are second type of light-emitting sub-pixels and third type of light-emitting sub-pixels that are sequentially and alternately arranged in the column direction; or light-emitting sub-pixels located in an odd-numbered column in the plurality of light-emitting sub-pixels are first type of light-emitting sub-pixels, and light-emitting sub-pixels located in an even-numbered column in the plurality of light-emitting sub-pixels are second type of light-emitting sub-pixels and the third type of light-emitting sub-pixels that are sequentially and alternately arranged in the column direction. For example, referring to FIG. 18, the light-emitting sub-pixels located in the odd-numbered column in the plurality of light-emitting sub-pixels are the first type of light-emitting sub-pixels, and the light-emitting sub-pixels located in the even-numbered column in the plurality of light-emitting sub-pixels are the second type of light-emitting sub-pixels and the third type of light-emitting sub-pixels that are sequentially and alternately arranged in the column direction. The first type of light-emitting sub-pixels are the green light-emitting sub-pixels 101-G, the second type of light-emitting sub-pixels are the red light-emitting sub-pixels 101-R, and the third type of light-emitting sub-pixels are the blue light-emitting sub-pixels 101-B. An arrangement of the light-emitting sub-pixels in the first region A1 may be as shown in FIG. 18. A red light-emitting sub-pixel 101-R, a green light-emitting sub-pixel 101-G and a blue light-emitting sub-pixel 101-B constitute a light-emitting pixel 160. An arrangement of the light-emitting sub-pixels in the second region is not limited, which may be consistent with the arrangement of the first region, or may be different from the arrangement of the first region.

Figure 19:
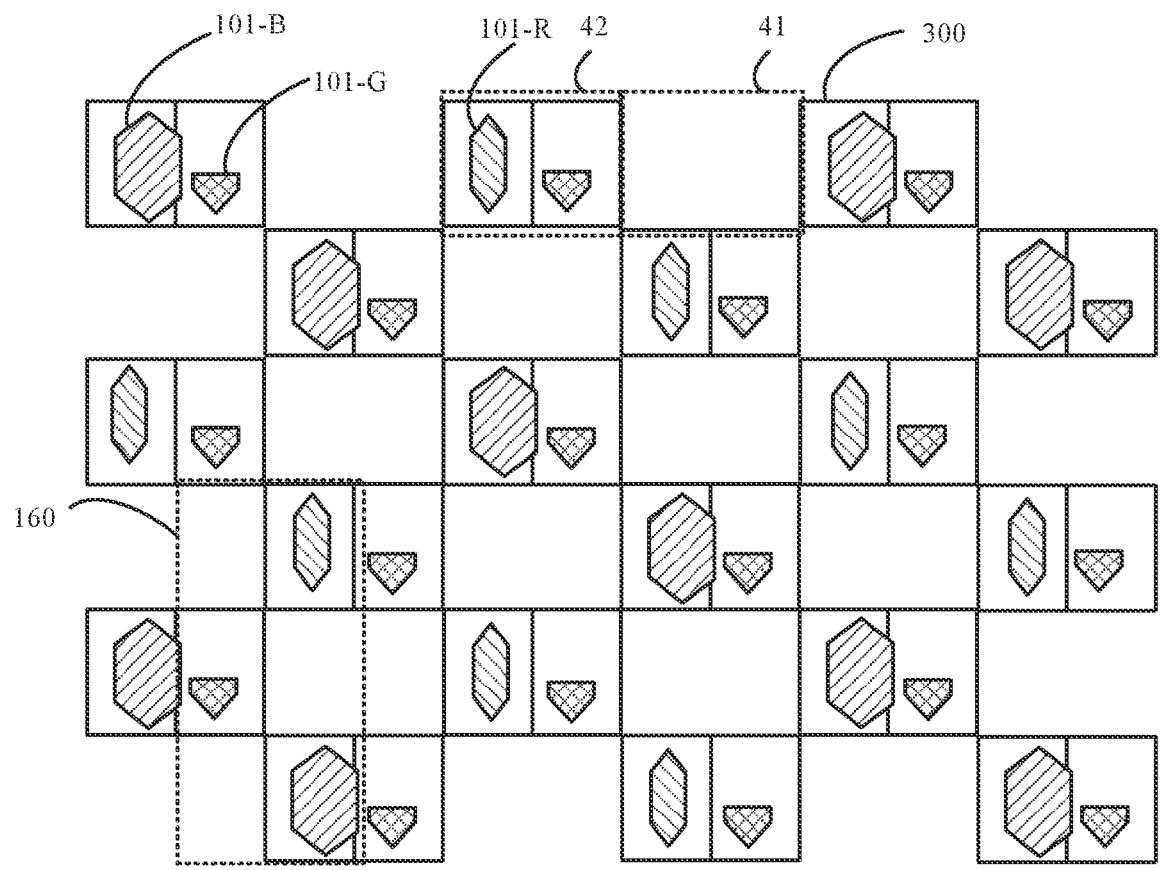
FIG. 19 is a diagram showing another distribution of light-emitting sub-pixels of a display panel, in accordance with embodiments of the present disclosure.

For another example, referring to FIG. 19, light-emitting sub-pixels located in an even-numbered column in the plurality of light-emitting sub-pixels are first type of light-emitting sub-pixels, and light-emitting sub-pixels located in an odd-numbered column in the plurality of light-emitting sub-pixels are second type of light-emitting sub-pixels and third type of light-emitting sub-pixels that are sequentially and alternately arranged in the column direction. The first type of light-emitting sub-pixels are the green light-emitting sub-pixels 101-G, the second type of light-emitting sub-pixels are the blue light-emitting sub-pixels 101-B, and the third type of light-emitting sub-pixels are the red light-emitting sub-pixels 101-R. A red light-emitting sub-pixel 101-R, a green light-emitting sub-pixel 101-G, and a blue light-emitting sub-pixel 101-B constitute a light-emitting pixel 160.

For example, in two adjacent columns of light-emitting sub-pixels, every three continuous sub-pixels of different types in the column direction constitute a light-emitting pixel.

For example, each first type of light-emitting sub-pixel in each row of light-emitting sub-pixels, a second type of light-emitting sub-pixel adjacent to the first type of light-emitting sub-pixel in the column direction in a previous row of light-emitting sub-pixels, and a third type of light-emitting sub-pixel adjacent to the first type of light-emitting sub-pixel in the column direction in a next row of light-emitting sub-pixels constitute a pixel. Referring to FIG. 18, a green light-emitting sub-pixel 101-G in a fourth row of light-emitting sub-pixels, a red light-emitting sub-pixel 101-R adjacent to the green light-emitting sub-pixel 101-G in the column direction in a third row of light-emitting sub-pixels, and a blue light-emitting sub-pixel 101-B adjacent to the green light-emitting sub-pixel 101-G in the column direction in a fifth row of light-emitting sub-pixels constitute a light-emitting pixel 160.

Alternatively, each first type of light-emitting sub-pixel in each row of light-emitting sub-pixels, a third type of light-emitting sub-pixel adjacent to the first type of light-emitting sub-pixel in the column direction in a previous row of light-emitting sub-pixels, and a second type of light-emitting sub-pixel adjacent to the first type of light-emitting sub-pixel in the column direction in a next row of light-emitting sub-pixels constitute a pixel. For example, referring to FIG. 18, a green light-emitting sub-pixel 101-G in a second row of light-emitting sub-pixels, a blue light-emitting sub-pixel 101-B adjacent to the green light-emitting sub-pixel 101-G in the column direction in a first row of light-emitting sub-pixels, and a red light-emitting sub-pixel 101-R adjacent to the green light-emitting sub-pixel 101-G in the column direction in a third row of light-emitting sub-pixels constitute a light-emitting pixel 160. For another example, referring to FIG. 19, a green light-emitting sub-pixel 101-G in a fifth row of light-emitting sub-pixels, a red light-emitting sub-pixel 101-R adjacent to the green light-emitting sub-pixel 101-G in the column direction in a fourth row of light-emitting sub-pixels, and a blue light-emitting sub-pixel 101-B adjacent to the green light-emitting sub-pixel 101-G in the column direction in a sixth row of light-emitting sub-pixels constitute a light-emitting pixel 160.

In the case where the circuit vacancy regions and the circuit groups are staggered, and m is equal to n and n is equal to 2 (i.e., m=n=2), in the arrangements of the light-emitting sub-pixels shown in FIGS. 18 and 19, each green light-emitting sub-pixel 101-G, and a blue light-emitting sub-pixel 101-B and a red light-emitting sub-pixel 101-R, which are located in a column adjacent to a column where the green light-emitting sub-pixel 101-G is located and respectively located in rows adjacent to a row where the green light-emitting sub-pixel 101-G is located, constitute a light-emitting pixel 160. Moreover, the blue light-emitting sub-pixel 101-B may constitute a light-emitting pixel 160 with a red light-emitting pixel 101-R and a green light-emitting sub-pixel 101-G in other rows, and the red light-emitting sub-pixel 101-R may constitute a light-emitting pixel 160 with a blue light-emitting pixel 101-B and a green light-emitting sub-pixel 101-G in other rows. That is, the blue light-emitting sub-pixel 101-B and the red light-emitting sub-pixel 101-R are each shared. Compared FIGS. 18 and 19 to FIG. 17, it can be seen that the design in the embodiments of the present disclosure is able to significantly improve the light transmittance of the first region A1 of the display panel. In the first region A1, a plurality of circuit vacancy regions 41 exist, and the occupancy ratio of the pixel driving circuits 300 is about 50%. That is, compared to the normal display region where no circuit vacancy region 41 is disposed, pixels per inch (PPI) is reduced by about 50%, so that the first region A1 becomes a region with a low PPI, which is less than a PPI of the second region.

Some embodiments of the present disclosure provide the display device. The display device includes the display panel in any one of the above embodiments.

Figure 20:
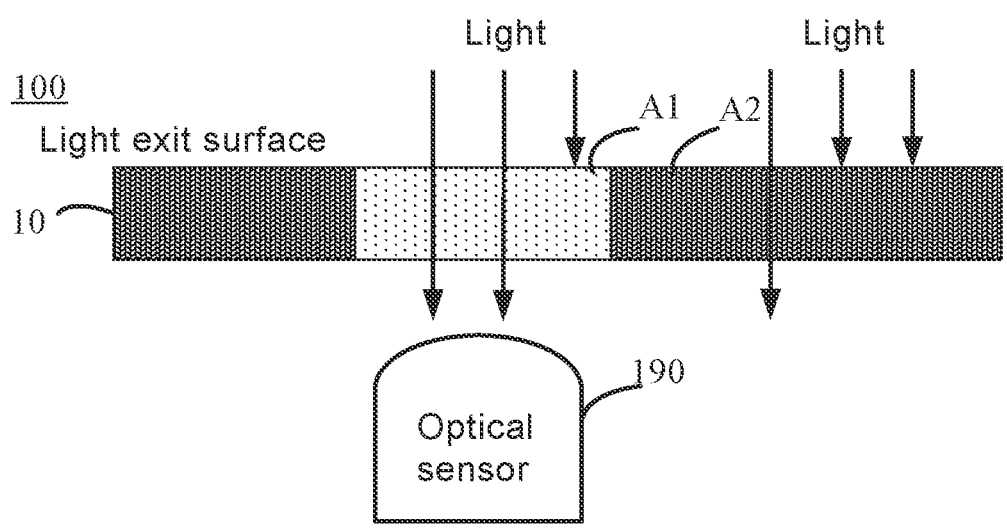
FIG. 20 is a structural diagram of a display device, in accordance with embodiments of the present disclosure.

For example, referring to FIG. 20, in addition to the display panel 10, the display device 100 further includes an optical sensor 190 disposed on a side of the display panel 10 facing away from a light exit surface of the display panel 10, and the optical sensor 190 directly faces the first region A1.

The optical sensor 190 directly faces the first region A1, which means that an orthographic projection of the optical sensor 190 on the display panel 10 in a vertical direction falls within the first region A1. That is, the orthographic projection of the optical sensor 190 on the display panel 10 in the vertical direction may be less than or equal to the first region A1 in size.

The optical sensor 190 is disposed on the side of the display panel 10 facing away from the light exit surface. That is, the optical sensor 190 is an under-screen optical sensor, and the under-screen optical sensor is able to obtain sufficient light through the first region A1 with the low PPI, which directly faces the under-screen optical sensor, of the display region, so as to ensure the function of the under-screen optical sensor.

The above descriptions are merely specific implementation manners of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a display region and a bezel region located on a periphery of the display region, the display region including a first region and a second region; the display panel comprising a plurality of pixel driving circuits located in the first region, a plurality of pixel driving circuits located in the second region, and a plurality of light-emitting devices; wherein a density of the pixel driving circuits in the first region is less than a density of the pixel driving circuits in the second region;

wherein the plurality of pixel driving circuits located in the first region are distributed in rows and columns; in the first region, each row of pixel driving circuits includes a plurality of circuit groups; and each circuit group includes m pixel driving circuits that are continuously distributed, and m is greater than or equal to 1;

the first region includes a plurality of circuit vacancy regions distributed in rows and columns, and no pixel driving circuit and no light-emitting device are disposed at the plurality of circuit vacancy regions; and the plurality of circuit groups and a same row of circuit vacancy regions are alternately arranged.

2. The display panel according to claim 1, wherein a number of pixel driving circuits in each row in the first region is less than a number of the columns of the plurality of pixel driving circuits in the first region.

3. The display panel according to claim 2, wherein no pixel driving circuit is disposed at n continuous positions between every two adjacent circuit groups in a row, and n is greater than or equal to 1.

4. The display panel according to claim 3, wherein m is equal to n, and n is equal to 2.

5. The display panel according to claim 4, further comprising at least one first signal line; wherein in the first region, pixel driving circuits located in two adjacent rows are connected in sequence through a first signal line in the at least one first signal line according to an arrangement sequence of the pixel driving circuits located in the two adjacent rows in a row direction.

6. The display panel according to claim 5, wherein according to an arrangement sequence of pixel driving circuits in an i-th row and an (i+1)-th row in the row direction, enable signal terminals in the i-th row of pixel driving circuits and enable signal terminals in the (i+1)-th row of pixel driving circuits are connected in sequence through a first signal line in the at least one first signal line, and i is greater than or equal to 1.

7. The display panel according to claim 6, further comprising a plurality of control signal terminals; wherein i is an odd number, the enable signal terminals in the i-th row of pixel driving circuits are connected to an (i+1)/2-th control signal terminal in the plurality of control signal terminals; or i is an even number, the enable signal terminals in the i-th row of pixel driving circuits are connected to an i/2-th control signal terminal in the plurality of control signal terminals; and/or the display panel further comprising an initialization voltage terminal connected to each pixel driving circuit.

8. The display panel according to claim 4, wherein according to an arrangement sequence of pixel driving circuits in an i-th row and an (i+1)-th row in the row direction, scan signal terminals in the i-th row of pixel driving circuits and reset signal terminals in the (i+1)-th row of pixel driving circuits are connected in sequence through a first signal line in the at least one first signal line, and i is greater than or equal to 1.

9. The display panel according to claim 8, further comprising a plurality of gate signal terminals, wherein an (i+1)-th gate signal terminal in the plurality of gate signal terminals, the scan signal terminals in the i-th row of pixel driving circuits, and the reset signal terminals in the (i+1)-th row of pixel driving circuits are connected in sequence through the first signal line.

10. The display panel according to claim 4, wherein pixel driving circuits located in a same column in the first region are respectively distributed in odd-numbered rows, or are respectively distributed in even-numbered rows.

11. The display panel according to claim 10, wherein each pixel driving circuit is coupled to a light-emitting device in the plurality of light-emitting devices to constitute a light-emitting sub-pixel; and a plurality of light-emitting sub-pixels include a first type of light-emitting sub-pixels, a second type of light-emitting sub-pixels and a third type of light-emitting sub-pixels; light-emitting sub-pixels of a same type have a same light-emitting color, and light-emitting sub-pixels of different types have different light-emitting colors, wherein in the first region, light-emitting sub-pixels located in an odd-numbered column in the plurality of light-emitting sub-pixels are first type of light-emitting sub-pixels, and light-emitting sub-pixels located in an even-numbered column in the plurality of light-emitting sub-pixels are second type of light-emitting sub-pixels and third type of light-emitting sub-pixels that are sequentially and alternately arranged in a column direction; or light-emitting sub-pixels located in an even-numbered column in the plurality of light-emitting sub-pixels are first type of light-emitting sub-pixels, and light-emitting sub-pixels located in an odd-numbered column in the plurality of light-emitting sub-pixels are second type of light-emitting sub-pixels and third type of light-emitting sub-pixels that are sequentially and alternately arranged in a column direction.

12. The display panel according to claim 11, wherein in two adjacent columns of light-emitting sub-pixels, every three continuous sub-pixels of different types in the column direction constitute a light-emitting pixel.

13. The display panel according to claim 2, wherein pixel driving circuits located in a same column in the first region are respectively distributed in odd-numbered rows, or are respectively distributed in even-numbered rows.

14. The display panel according to claim 13, further comprising at least one second signal line; wherein in the first region, pixel driving circuits located in two adjacent columns are connected in sequence through a second signal line in the at least one second signal line according to an arrangement sequence of the pixel driving circuits located in the two adjacent columns in a column direction; wherein the pixel driving circuits connected to the second signal line are alternately distributed in odd-numbered rows and even-numbered rows.

15. The display panel according to claim 14, wherein according to an arrangement sequence of pixel driving circuits in a j-th column and a (j+1)-th column in the column direction, supply voltage terminals in the j-th column of pixel driving circuits and supply voltage terminals in the (j+1)-th column of pixel driving circuits are connected in sequence through a second signal line in the at least one second signal line, and j is greater than or equal to 1.

16. The display panel according to claim 15, further comprising a first voltage terminal;

the first voltage terminal, the supply voltage terminals in the j-th column of pixel driving circuits, and the supply voltage terminals in the (j+1)-th column of pixel driving circuits are connected in sequence through the second signal line.

17. The display panel according to claim 14, wherein according to an arrangement sequence of pixel driving circuits in a j-th column and a (j+1)-th column in the column direction, data terminals in the j-th column of pixel driving circuits and data terminals in the (j+1)-th column of pixel driving circuits are connected in sequence through a second signal line in the at least one second signal line, and j is greater than or equal to 1.

18. The display panel according to claim 17, further comprising a plurality of data signal terminals; wherein
a data signal terminal in the plurality of data signal terminals, the data terminals in the j-th column of pixel driving circuits, and the data terminals in the (j+1)-th column of pixel driving circuits are connected in sequence through the second signal line.

19. A display device comprising the display panel according to claim 1.

20. The display device according to claim 19, further comprising an optical sensor disposed on a side of the display panel facing away from a light exit surface of the display panel, the optical sensor directly facing the first region.

\* \* \* \* \*